United States Patent
Choi

(10) Patent No.: US 10,905,009 B2
(45) Date of Patent: Jan. 26, 2021

(54) DISPLAY MODULE AND DISPLAY DEVICE INCLUDING THE SAME

(71) Applicant: SAMSUNG DISPLAY CO., LTD., Yongin-Si (KR)

(72) Inventor: Jinkuk Choi, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 16/452,947

(22) Filed: Jun. 26, 2019

(65) Prior Publication Data
US 2020/0022261 A1     Jan. 16, 2020

(30) Foreign Application Priority Data
Jul. 11, 2018   (KR) .................. 10-2018-0080672

(51) Int. Cl.
*H05K 1/14*     (2006.01)
*H01L 51/52*    (2006.01)
(Continued)

(52) U.S. Cl.
CPC ........... *H05K 1/148* (2013.01); *G06F 3/0412* (2013.01); *H01L 27/323* (2013.01); (Continued)

(58) Field of Classification Search
CPC ........ H05K 1/147; H05K 1/148; H05K 1/189; H05K 1/0204; H05K 1/0206; H05K 1/0207; H05K 1/0209; H05K 1/021; H05K 5/0017; H05K 5/03; H05K 7/20963; H05K 7/20972; H05K 2201/056; H05K 2201/10128; H05K 2201/10151; G06F 3/0412; H01L 72/323; H01L 72/3276; H01L 51/5246; H01L 51/5281; H01L 51/529; H01L 23/367; H01L 23/373
See application file for complete search history.

(56) References Cited

U.S. PATENT DOCUMENTS 6,111,629 A     8/2000  Matsuhira et al.
8,295,052 B2 *  10/2012 Itazawa ................... H05K 5/02
                                                     361/688
(Continued)

FOREIGN PATENT DOCUMENTS

JP    2011-176112 A    9/2011
KR    10-1211732 B1    12/2012
(Continued)

*Primary Examiner* — Tom V Sheng
(74) *Attorney, Agent, or Firm* — Lewis Roca Rothgerber Christie LLP

(57) ABSTRACT

A display device may include a heat radiation member on a lower surface of a display panel, a first circuit board overlapped with and electrically connected to a pad of the display panel and overlapped with the heat radiation member, a driving chip mounted on the first circuit board and located between the first circuit board and the heat radiation member, and an adhesive member coupling the first circuit board to the heat radiation member. When viewed in a plan view, the adhesive member may define an internal region in which the driving chip is located and a passage region connecting the internal region to an outer region of the adhesive member.

33 Claims, 16 Drawing Sheets

(51) Int. Cl.
  *H05K 1/18* (2006.01)
  *H01L 27/32* (2006.01)
  *H05K 5/00* (2006.01)
  *H05K 5/03* (2006.01)
  *H05K 7/20* (2006.01)
  *H05K 1/02* (2006.01)
  *G06F 3/041* (2006.01)

(52) U.S. Cl.
  CPC ........ *H01L 27/3276* (2013.01); *H01L 51/529* (2013.01); *H01L 51/5246* (2013.01); *H01L 51/5281* (2013.01); *H05K 1/0203* (2013.01); *H05K 1/189* (2013.01); *H05K 5/0017* (2013.01); *H05K 5/03* (2013.01); *H05K 7/20963* (2013.01); *H05K 2201/056* (2013.01); *H05K 2201/10128* (2013.01); *H05K 2201/10151* (2013.01)

(56) References Cited

U.S. PATENT DOCUMENTS

| | | | |
|---|---|---|---|
| 9,460,644 B2 | 10/2016 | Namkung et al. | |
| 9,674,961 B2 | 6/2017 | Ahn | |
| 9,798,414 B2 | 10/2017 | Kim et al. | |
| 9,842,535 B2* | 12/2017 | Kim | G09G 3/3208 |
| 10,048,786 B2 | 8/2018 | Ahn et al. | |
| 10,559,603 B2* | 2/2020 | Chen | H01L 27/124 |
| 2003/0020152 A1* | 1/2003 | Inoue | H01L 23/552 257/684 |
| 2005/0052442 A1* | 3/2005 | Takenaka | G02F 1/13452 345/204 |
| 2011/0204497 A1 | 8/2011 | Matsuda et al. | |
| 2011/0311834 A1 | 12/2011 | Hanafusa | |
| 2017/0099736 A1 | 4/2017 | Jung et al. | |
| 2019/0116405 A1* | 4/2019 | Noh | G06F 1/1626 |
| 2019/0272407 A1* | 9/2019 | Park | H01L 27/3234 |

FOREIGN PATENT DOCUMENTS

| | | |
|---|---|---|
| KR | 10-2015-0124543 A | 11/2015 |
| KR | 10-2016-0106829 A | 9/2016 |
| KR | 10-2016-0110675 A | 9/2016 |
| KR | 10-2016-0141260 A | 12/2016 |
| KR | 10-2017-0040435 A | 4/2017 |
| KR | 10-1849339 B1 | 4/2018 |

* cited by examiner

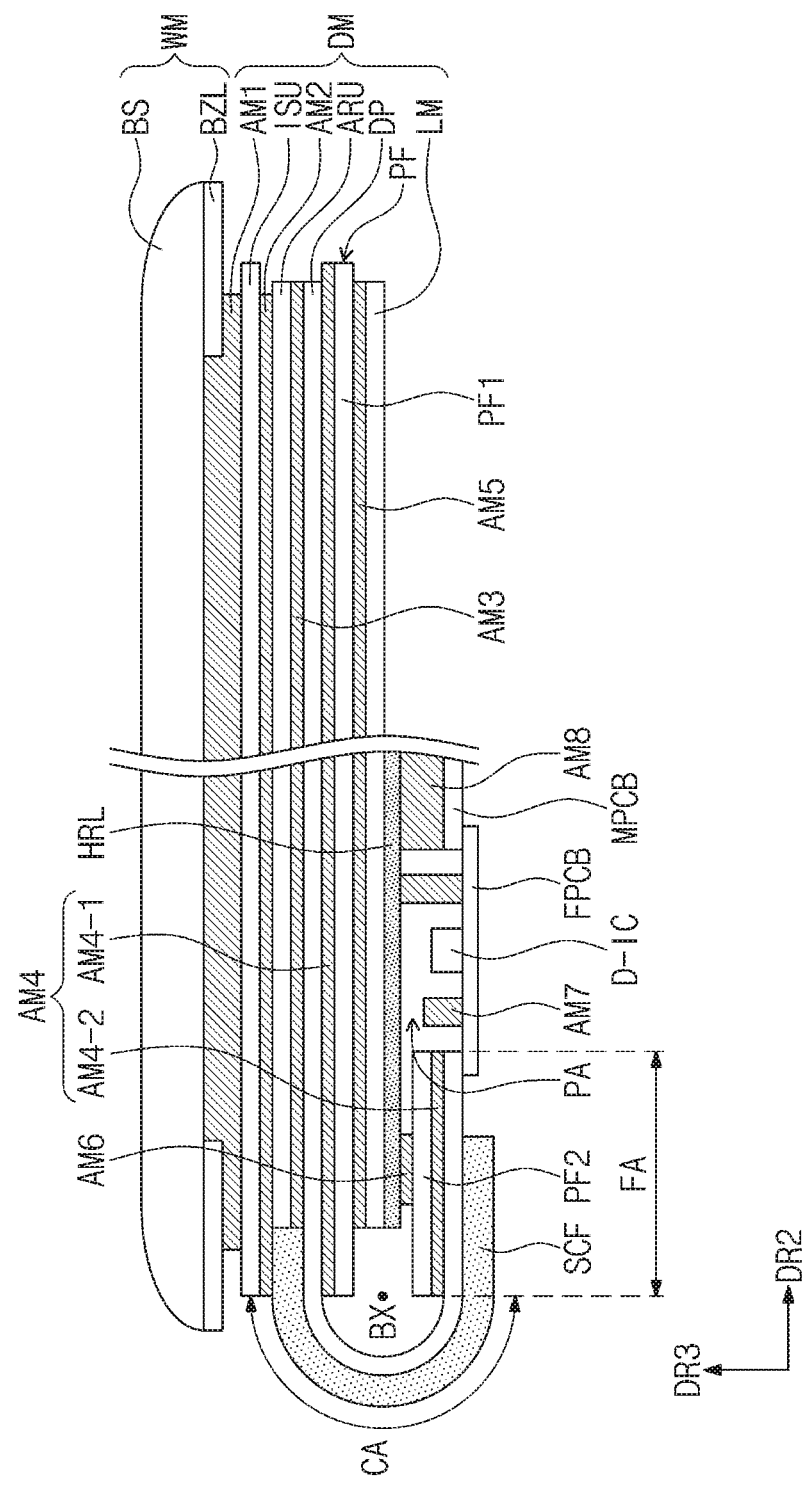

DISPLAY MODULE AND DISPLAY DEVICE INCLUDING THE SAME

CROSS-REFERENCE TO RELATED APPLICATIONS

This application claims priority to and the benefit of Korean Patent Application No. 10-2018-0080672, filed on Jul. 11, 2018 in the Korean Intellectual Property Office, the entire content of which is hereby incorporated by reference.

BACKGROUND

1. Field

Aspects of embodiments of the present disclosure relate to a display module and a display device including the same.

2. Description of the Related Art

Electronic devices, such as smartphones, tablets, notebook computers, and smart television sets, are being developed. The electronic device includes a display device that is used to provide information to a user. The electronic device further includes various electronic modules, in addition to the display device.

The electronic device is fabricated by assembling the display device and the electronic modules. Here, the electronic device includes an external case and a bracket, which are used to organizationally arrange the electronic modules. The display device includes a display panel and electronic components coupled with the display panel.

SUMMARY

According to an aspect of embodiments of the inventive concept, a display module is configured to have an improved heat radiation property.

According to another aspect of embodiments of the inventive concept, a display device including the display module is provided.

According to one or more embodiments, a display device may include a window and a display module on a lower surface of the window. The display module may include a display panel, a lower member, a heat radiation member, a first circuit board, a driving chip, and a first adhesive member. The display panel may include a display substrate including a base layer, a pixel on the base layer, a signal line on the base layer, and a pad connected to the signal line. The lower member may be on a lower surface of the display panel, and the heat radiation member may be on a lower surface of the lower member and may have a thermal conductivity of 200 W/mK or higher. The first circuit board may be overlapped with and electrically connected to the pad and may be overlapped with the heat radiation member. The driving chip may be mounted on the first circuit board and may be located between the first circuit board and the heat radiation member. The adhesive member may couple the first circuit board to the heat radiation member. When viewed in a plan view, the adhesive member may define an internal region in which the driving chip is located and a passage region connecting the internal region to an outer region of the adhesive member.

In an embodiment, the lower member may include at least one of a light-blocking member and an elastic member.

In an embodiment, the first circuit board may include a first portion overlapped with the pad, a second portion, which is extended from the first portion and has a curvature, and a third portion, which is extended from the second portion and is overlapped with the lower member, and on which the driving chip is mounted.

In an embodiment, the adhesive member may include a plurality of stacked layers, and at least one layer of the plurality of stacked layers may be absent in the passage region. The at least one layer may be an adhesive layer.

In an embodiment, the heat radiation member may include a metal layer.

In an embodiment, the display device may further include a second circuit board including a first pad, which is electrically connected to the first circuit board, and a second pad, which is overlapped with the metal layer and is electrically connected to the metal layer.

In an embodiment, the display device may further include an input detection sensor arranged between the window and the display panel and including a sensor electrode.

In an embodiment, the display panel may further include an encapsulation substrate coupled with the display substrate.

In an embodiment, the sensor electrode may be directly on the encapsulation substrate.

In an embodiment, the display device may further include an insulating layer, on a lower surface of the heat radiation member and overlapped with the driving chip.

In an embodiment, the display substrate may include a first portion on which the pixels are located, a second portion extended from the first portion and having a curvature, and a third portion extended from the second portion and overlapped with the lower member.

According to one or more embodiments, a display device may include a window, a display module on a lower surface of the window, and a polarization film between the window and the display module. The display module may include a display panel, a sensor electrode, a lower member, a heat radiation member, a first circuit board, a driving chip, and a first adhesive member. The display panel may include a display substrate including a signal line and a pad connected to the signal line and an encapsulation substrate facing the display substrate. The sensor electrode may be directly on an upper surface of the encapsulation substrate. The lower member may be on a lower surface of the display panel.

In an embodiment, the heat radiation member may be on a lower surface of the lower member and may have a thermal conductivity of 200 W/mK or higher. The first circuit board may be overlapped with and electrically connected to the pad and may be overlapped with the heat radiation member. The driving chip may be mounted on the first circuit board and may be located between the first circuit board and the lower member. The first adhesive member may couple the first circuit board to the lower member. When viewed in a plan view, the first adhesive member may define an internal region in which the driving chip is located and a passage region connecting the internal region to an outer region of the first adhesive member.

In an embodiment, the first circuit board may include a first portion overlapped with the pad, a second portion extended from the first portion and having a curvature, and a third portion extended from the second portion and overlapped with the lower member, and on which the driving chip is mounted.

In an embodiment, the display device may further include a second circuit board electrically connected to the first circuit board and overlapped with the heat radiation member, and a second adhesive member, which connects the second circuit board to the lower member.

In an embodiment, the first adhesive member may be thicker than the second adhesive member.

In an embodiment, the heat radiation member may include a metal layer. The second circuit board may include a first pad electrically connected to the first circuit board, and a second pad overlapped with the metal layer and electrically connected to the metal layer. The second adhesive member may include an anisotropic conductive film.

According to one or more embodiments, a display module may include a display substrate, an encapsulation substrate, a sealing member, a heat radiation member, a first circuit board, a driving chip, and an adhesive member. The display substrate may include a base layer, a light-emitting diode on the base layer, and a signal line on the base layer. The encapsulation substrate may face the display substrate, and the sealing member may couple the display substrate to the encapsulation substrate. The heat radiation member may be on a lower surface of the display substrate and may have a thermal conductivity of 200 W/mK or higher. The first circuit board may be overlapped with and may be electrically connected to an end portion of the signal line and overlapped with the heat radiation member. The driving chip may be mounted on the first circuit board and may be located between the first circuit board and the heat radiation member. The adhesive member may couple the first circuit board to the heat radiation member and may enclose the driving chip when viewed in a plan view.

In an embodiment, the adhesive member may include a first portion having a first thickness and a second portion having a second thickness smaller than the first thickness. A length of the second portion may be 5% to 20% of a length of the driving chip.

In an embodiment, the adhesive member may include a base film corresponding to the first portion and the second portion, a first adhesive layer corresponding to the base film, and a second adhesive layer, which is on the first portion and is not on the second portion.

According to one or more embodiments, a display device may include a window, a display module on a lower surface of the window, and a polarization film between the window and the display module. The display module may include a display panel, a lower member, a heat radiation member, a circuit board, a driving chip, and a spacer. The display panel may include a signal line and a pad connected to the signal line. The lower member may be on a lower surface of the display panel. The heat radiation member may be on a lower surface of the lower member. The circuit board may be electrically connected to the pad, and a portion of the circuit board may be below the heat radiation member.

In an embodiment, the driving chip may be mounted on the circuit board and may be between the circuit board and the heat radiation member. The insulating layer may be on a lower surface of the heat radiation member and may be overlapped with the driving chip. The spacer may be between the circuit board and the heat radiation member. The spacer may include a first portion having a first thickness and a second portion having a second thickness smaller than the first thickness. The first portion and the second portion may define a closed line when viewed in a plan view. The driving chip may be located within an internal region of the closed line when viewed in the plan view.

BRIEF DESCRIPTION OF THE DRAWINGS

Example embodiments will be more clearly understood from the following brief description taken in conjunction with the accompanying drawings. The accompanying drawings represent some non-limiting, example embodiments as described herein.

FIGS. 7B and 7C are cross-sectional views illustrating a display device according to an embodiment of the inventive concept.

Figure 1A:
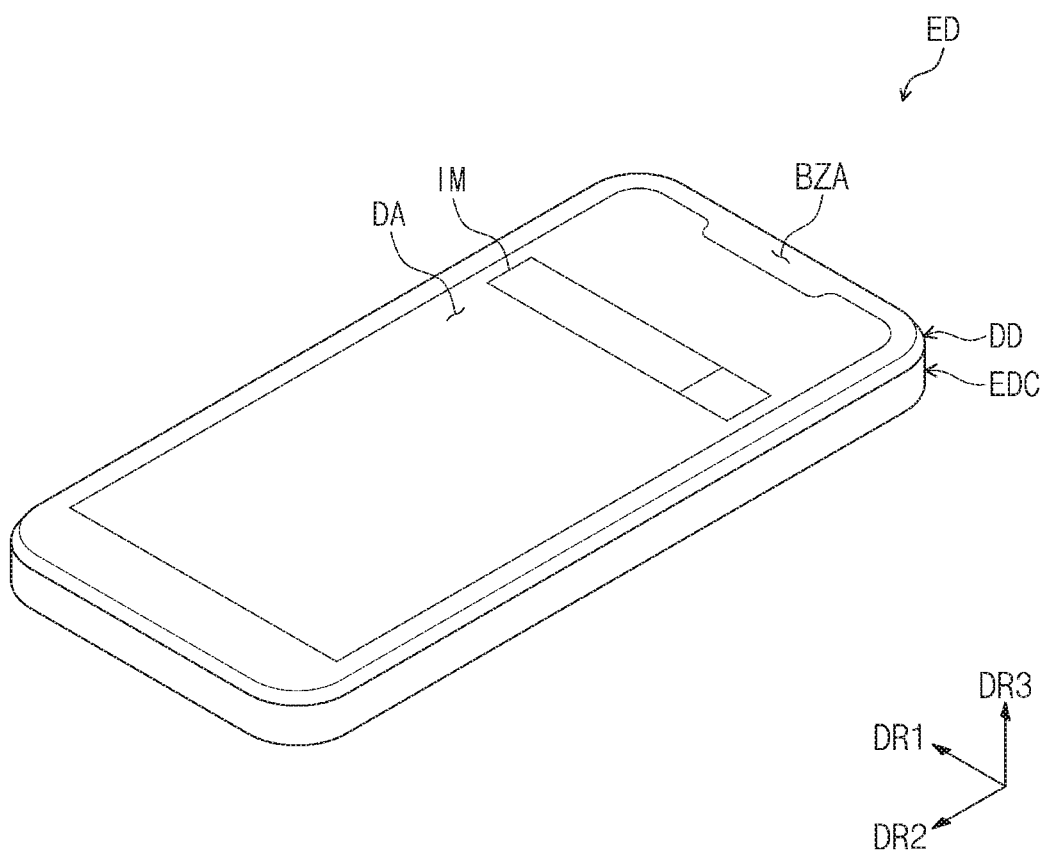
FIG. 1A is a perspective view illustrating an electronic device according to an embodiment of the inventive concept.

It is noted that these figures are intended to illustrate the general characteristics of methods, structures, and/or materials utilized in certain example embodiments and to supplement the written description provided below. These drawings may not, however, be to scale and may not precisely reflect the precise structural or performance characteristics of any given embodiment, and should not be interpreted as defining or limiting the range of values or properties encompassed by example embodiments. For example, the relative thicknesses and positioning of modules, layers, regions, and/or structural elements may be reduced or exaggerated for clarity. The use of similar or same reference numbers in the various drawings is intended to indicate the presence of a similar or same element or feature.

DETAILED DESCRIPTION

Some example embodiments of the inventive concept will now be described more fully with reference to the accompanying drawings, in which some example embodiments are shown. Embodiments of the inventive concept may, however, be embodied in many different forms and should not be construed as being limited to the embodiments set forth herein; rather, these embodiments are described so that this disclosure will be thorough and complete, and will fully convey the concept of example embodiments to those of ordinary skill in the art. In the drawings, the thicknesses of layers and regions may be exaggerated for clarity. Like reference numerals in the drawings denote like elements, and, thus, their repeated description may be omitted.

It is to be understood that when an element is referred to as being "connected" or "coupled" to another element, it may be directly connected or coupled to the other element or one or more intervening elements may be present. In contrast, when an element is referred to as being "directly connected" or "directly coupled" to another element, there are no intervening elements present. Like numbers indicate like elements throughout. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of example embodiments. As used herein, the singular forms "a," "an," and "the" are intended to include the plural forms as well, unless the context clearly indicates otherwise. It is to be further understood that the terms "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Example embodiments of the inventive concept may be described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concept should not be construed as limited to the particular shapes of regions illustrated herein, but are to include deviations in shapes that result, for example, from manufacturing.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
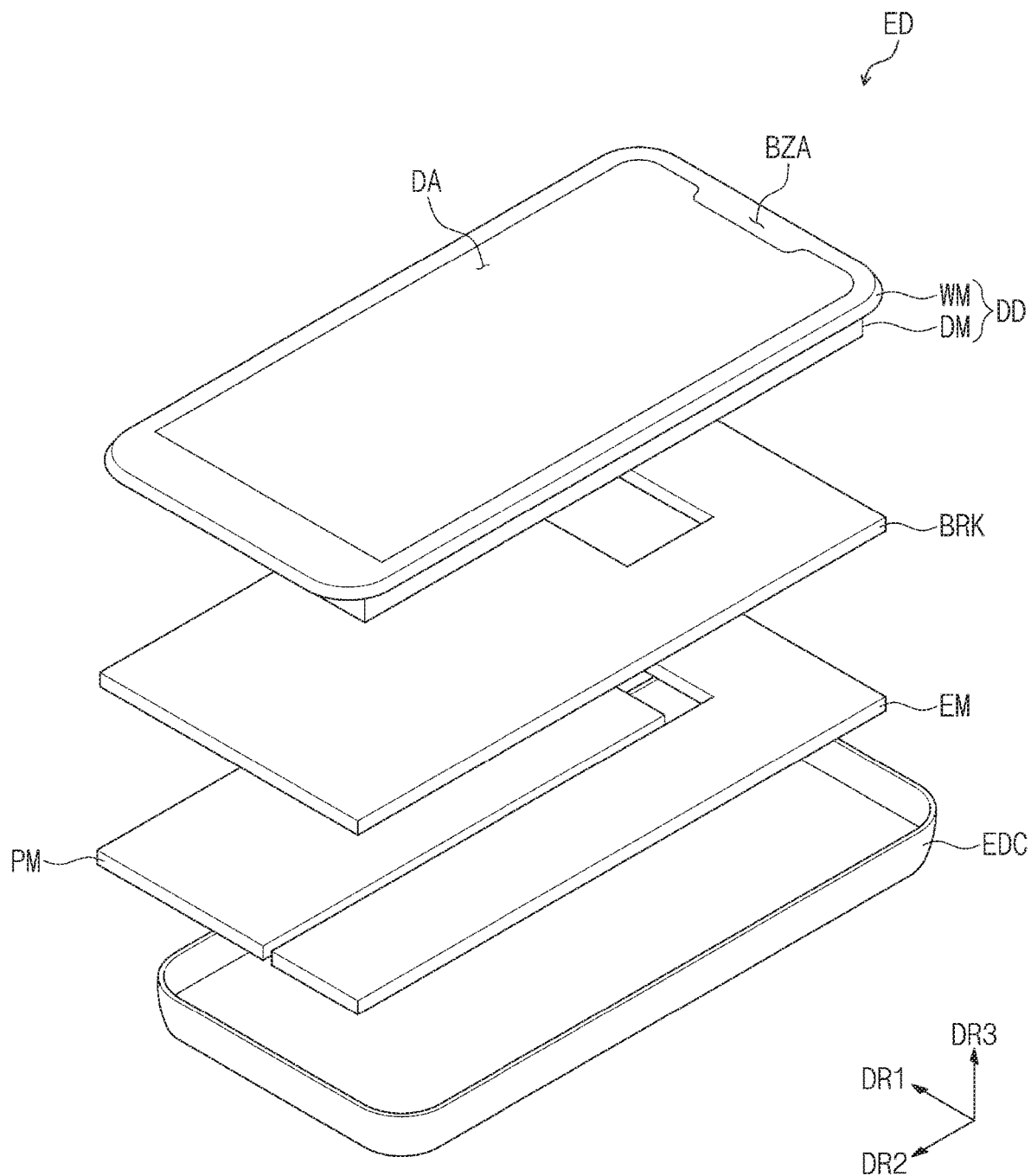
FIG. 1B is an exploded perspective view illustrating an electronic device according to an embodiment of the inventive concept.
Figure 2:
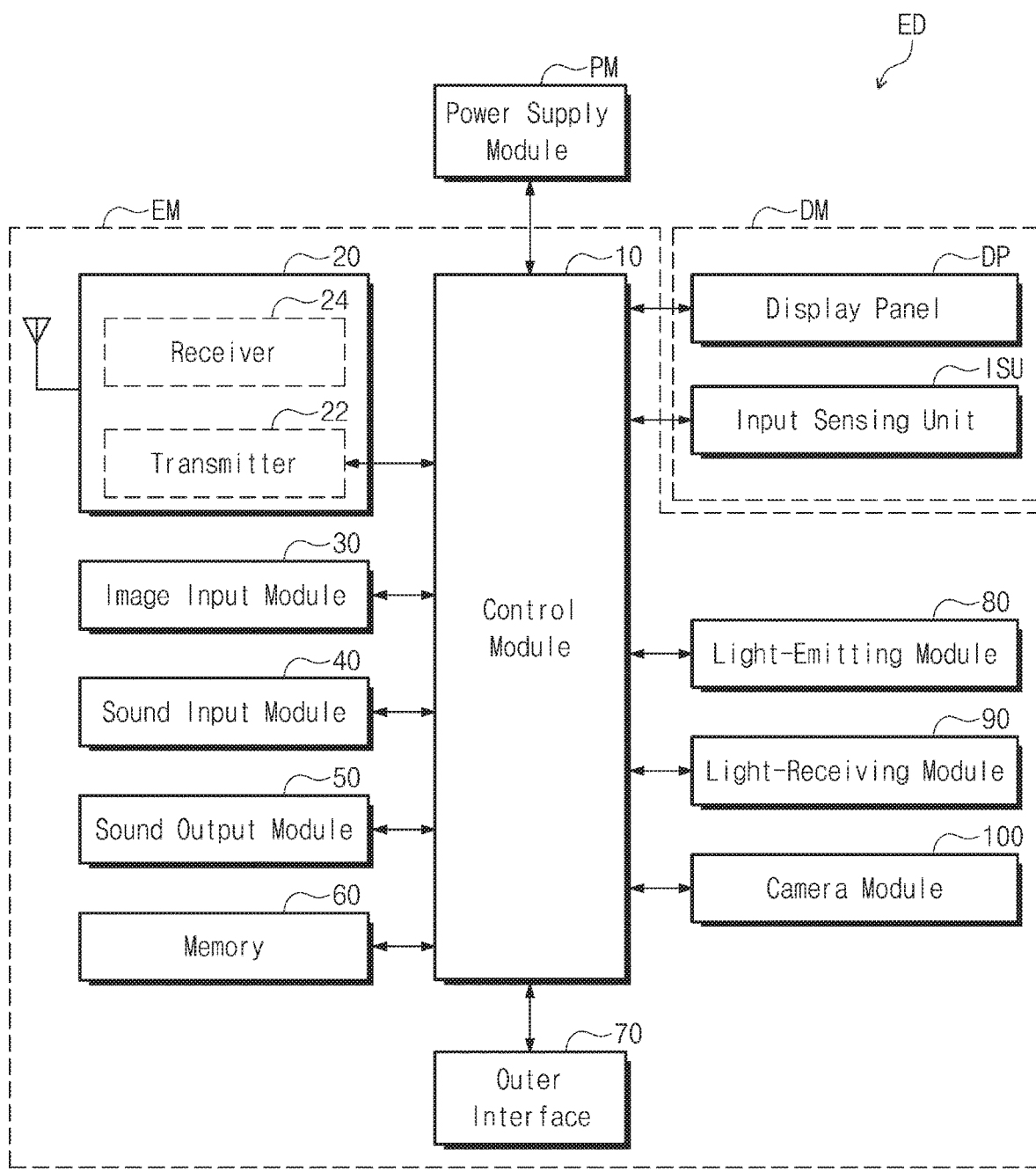
FIG. 2 is a block diagram illustrating an electronic device according to an embodiment of the inventive concept.

FIG. 1A is a perspective view of an electronic device ED according to an embodiment of the inventive concept; FIG. 1B is an exploded perspective view of the electronic device ED according to an embodiment of the inventive concept; and FIG. 2 is a block diagram of the electronic device ED according to an embodiment of the inventive concept.

In the present embodiment, a smartphone is illustrated as an example of the electronic device ED, but the inventive concept is not limited thereto. In an embodiment, the electronic device ED may be one of tablet computers, notebook computers, and smart television sets.

As shown in FIG. 1A, a display surface, which is used to display an image IM, may be parallel to a plane defined by a first direction axis DR1 and a second direction axis DR2. The display surface may include a display region DA and a bezel region BZA adjacent to the display region DA. FIG. 1A illustrates an internet search window as an example of the image IM. In an embodiment, the display region DA may have a rectangular shape. In an embodiment, the bezel region BZA may be disposed to enclose the display region DA. In other words, the bezel region BZA may serve as a border of the display surface. In certain embodiments, the bezel region BZA may be disposed at only two regions facing each other in the first direction axis DR1 or the second direction axis DR2.

Herein, a third direction axis DR3 will be used to refer to a normal direction of the display surface (i.e., a thickness direction of the electronic device ED). A front, top, or first surface of each member may be distinguished from a rear, bottom, or second surface thereof, based on a display direction of the image IM. However, directions indicated by the first to third direction axes DR1, DR2, and DR3 may be relative concepts, and in certain embodiments, they may be changed to indicate other directions. Herein, first to third directions may be directions indicated by the first to third direction axes DR1, DR2, and DR3, respectively, and will be identified with the same reference numbers.

As shown in FIGS. 1A and 1B, in an embodiment, the electronic device ED may include a display device DD, an electronic module EM, a power supply module PM, a bracket BRK, and an external case EDC. In FIGS. 1A and 1B, the components of the electronic device ED are illustrated in a simplified manner.

The display device DD may include a window WM and a display module DM. The window WM may serve as the front surface of the electronic device ED. The display module DM may be disposed on the rear surface of the window WM and may be used to display an image. In an embodiment, the display module DM may be configured to sense a user input (e.g., a touch event and/or pressure from a user). The display module DM may be electrically connected to the electronic module EM through a flexible circuit board or an electric connector.

In the present embodiment, the display module DM is illustrated to provide a flat display surface, but the shape of the display module DM may be changed. In an embodiment, the display module DM may be disposed to have curved edges, which face each other in the first direction DR1 and are bent from center portions thereof.

The power supply module PM may be configured to supply an electric power to the electronic device ED. The power supply module PM may include a typical battery module.

The bracket BRK may be combined with the display device DD and/or the external case EDC to divide an internal space of the electronic device ED into at least two spaces. The bracket BRK may provide a space for containing other components. In addition, the bracket BRK may be configured to fixedly support the display device DD, without shaking of the display device DD. The bracket BRK may have a connection hole, which is formed to have a shape corresponding to that of the electronic module EM and thereby to allow the electronic module EM to be fastened thereto. The bracket BRK may include a metallic or plastic part. Although the electronic device ED is illustrated to have the one bracket BRK, the electronic device ED may be configured to include a plurality of brackets BRK.

The external case EDC may be combined with the bracket BRK and/or the display device DD. The external case EDC may define an outer appearance of the electronic device ED. Although the external case EDC is illustrated as a single body, the external case EDC may include a plurality of bodies that are assembled with each other. The external case EDC may include a plurality of frames and/or plates, each of which is formed of at least one of glass, plastic, or metallic materials.

The electronic module EM may include a motherboard and various functional modules, which are mounted on the motherboard and are used to operate the electronic device ED. The motherboard may be electrically connected to the display device DD through a typical electric connector or the like. In an embodiment, the motherboard may include a rigid circuit board.

As shown in FIG. 2, in an embodiment, the electronic module EM may include a control module 10, a wireless communication module 20, an image input module 30, a sound input module 40, a sound output module 50, a memory 60, an outer interface 70, a light-emitting module 80, a light-receiving module 90, and a camera module 100. In an embodiment, at least one of the modules may not be mounted on the motherboard and may be electrically connected to the motherboard through a flexible circuit board or an electric connector.

The control module 10 may be configured to control overall operations of the electronic device ED. The control module 10 may be, for example, a microprocessor. In an embodiment, the display device DD may be activated or deactivated under the control of the control module 10. The control module 10 may control the image input module 30, the sound input module 40, and the sound output module 50, based on a user input signal received from the display device DD.

In an embodiment, the wireless communication module 20 may be configured to transmit and receive a wireless signal to and from another terminal via a Bluetooth or a Wi-Fi line. The wireless communication module 20 may be configured to transmit and receive a voice signal via a typical communication line. The wireless communication module 20 may include a transmitter 22, which is configured to modulate and transmit a signal to be transmitted, and a receiver 24, which is configured to demodulate the received signal.

The image input module 30 may be configured to process an image signal and to convert it into image data that can be displayed on the display device DD. The sound input module 40 may be configured to receive an external sound signal, which is obtained by a microphone in a recording mode, a voice recognition mode, and so forth, and then convert it into electrical voice data. The sound output module 50 may be configured to convert sound data, which is transmitted from the wireless communication module 20 or is stored in the memory 60, and to output the converted sound data to the outside.

The outer interface 70 may be configured to serve as an interface that is connected to an external charger, a wired/wireless data port, a card socket (e.g., a memory card or a SIM/UIM card), and so forth.

The light-emitting module 80 may be configured to generate and output light. In certain embodiments, the light-emitting module 80 may be configured to emit infrared light. The light-emitting module 80 may include a light-emitting diode (LED) device. The light-receiving module 90 may be configured to sense infrared light. The light-receiving module 90 may be configured to be activated when the infrared light incident thereto has an intensity higher than a reference value. In an embodiment, the light-receiving module 90 may be a complementary metal-oxide semiconductor (CMOS) image sensor. The infrared light emitted from the light-emitting module 80 may be reflected by an external object (e.g., a user's finger or face) and may be received by the light-receiving module 90. The number of optical components constituting each of the light-emitting module 80 and the light-receiving module 90 may be increased. The camera module 100 may be used to obtain an image of an external object. According to usage purpose or a position (e.g., within the electronic device ED) of the camera module 100, the number of the camera module 100 may be changed or increased.

Figure 3A:
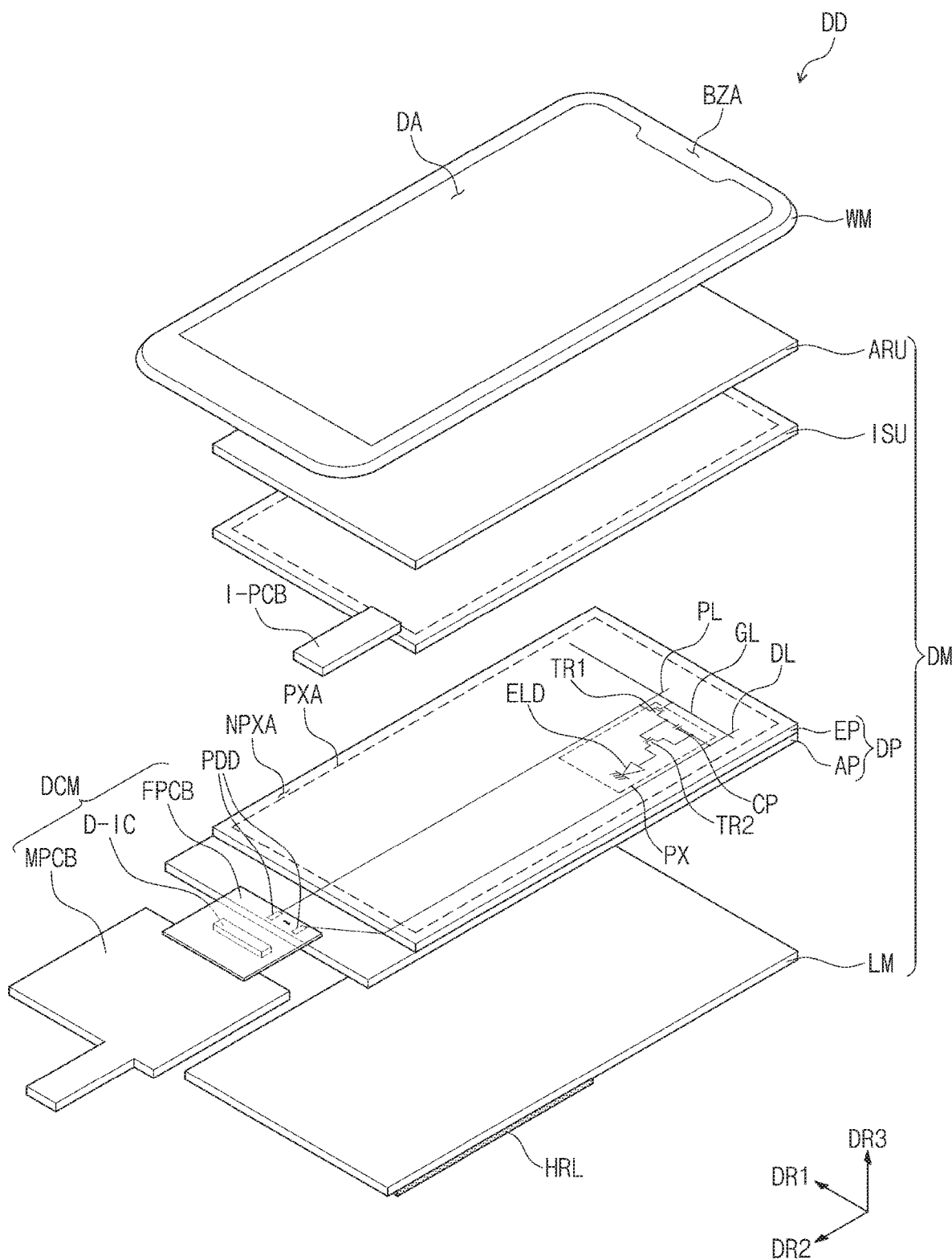
FIG. 3A is an exploded perspective view illustrating a display device according to an embodiment of the inventive concept.
Figure 3B:
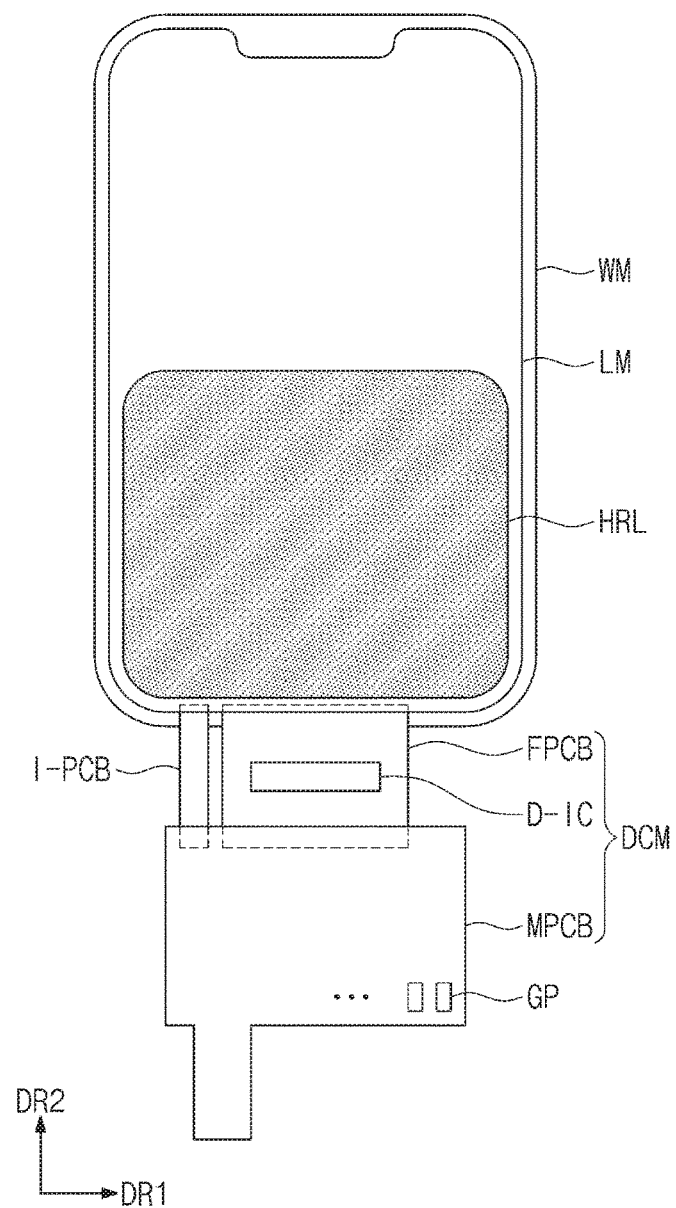
FIG. 3B is a rear view illustrating a display device according to an embodiment of the inventive concept.
Figure 3C:
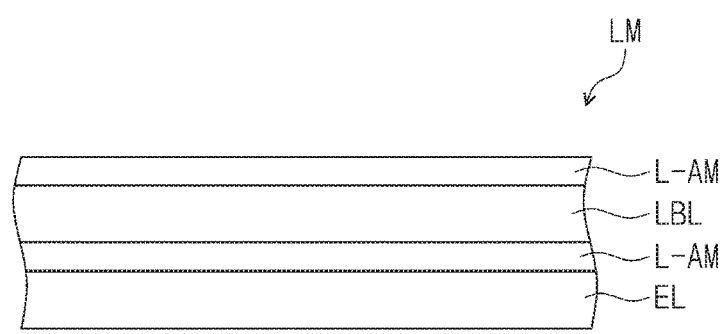
FIG. 3C is a cross-sectional view illustrating a lower member according to an embodiment of the inventive concept.
Figure 3D:
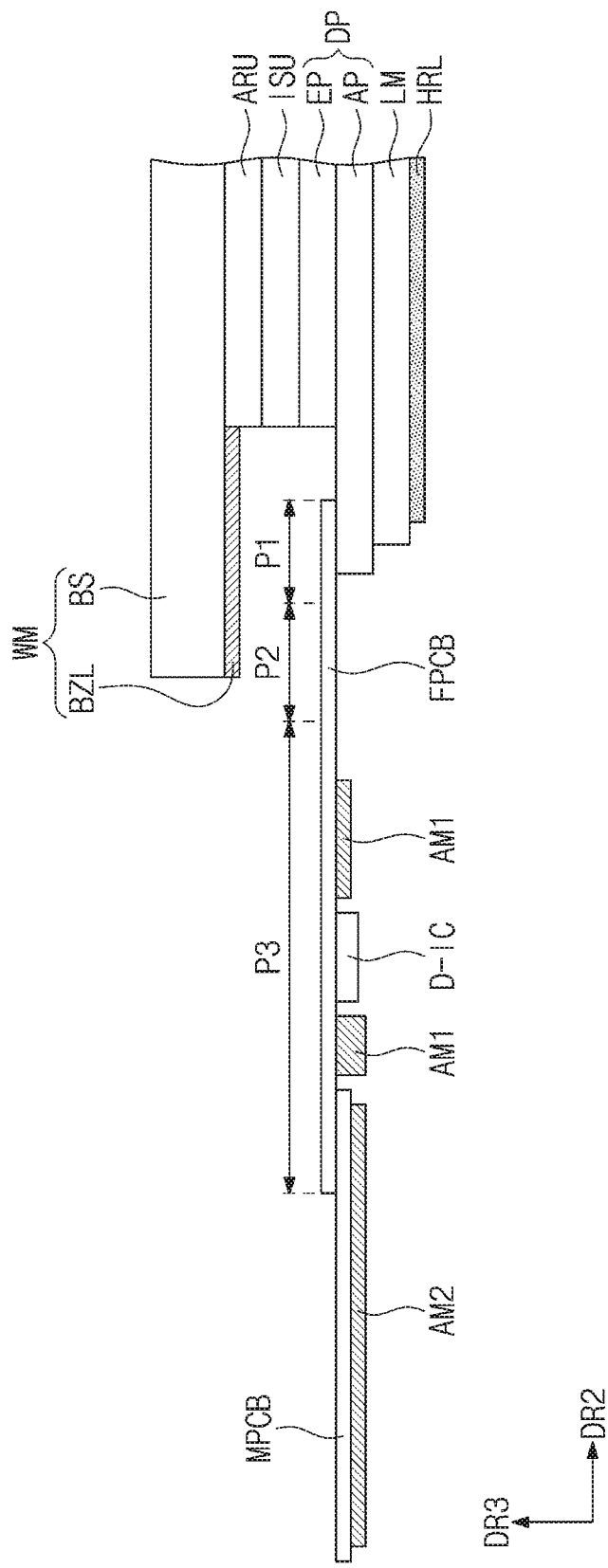
FIGS. 3D and 3E are cross-sectional views illustrating a display device according to an embodiment of the inventive concept.
Figure 3E:
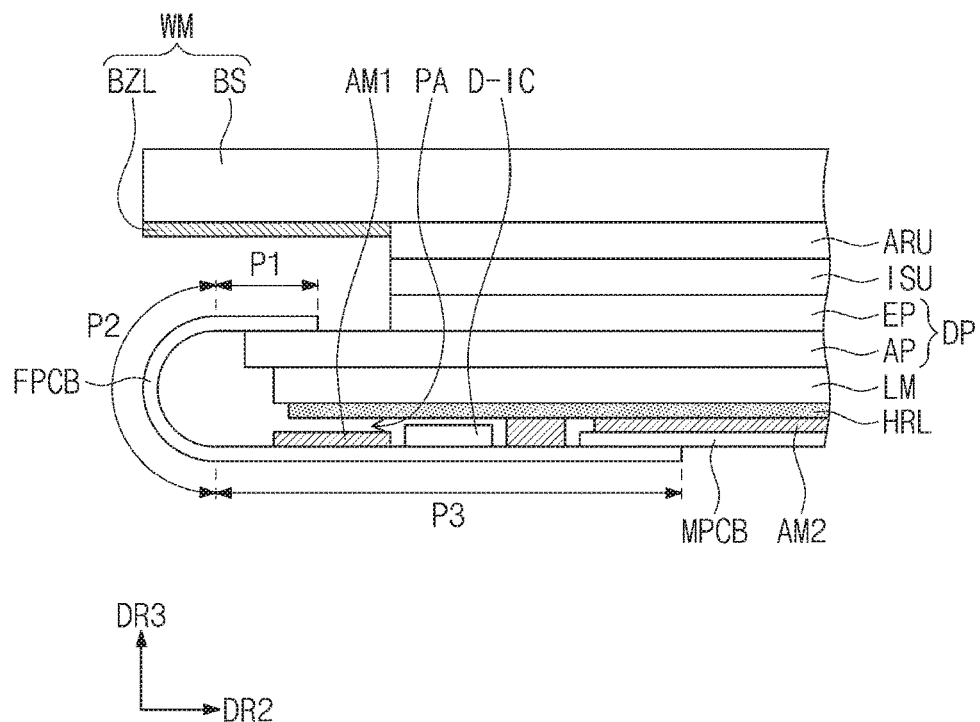
Figure 3F:
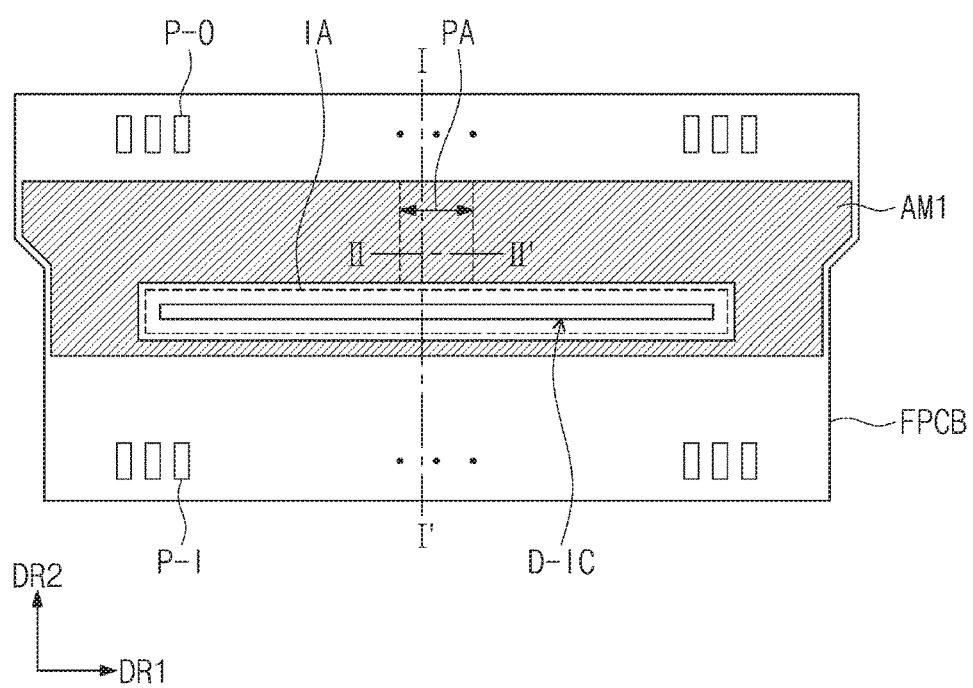
FIG. 3F is a plan view illustrating a circuit board according to an embodiment of the inventive concept.
Figure 3G:
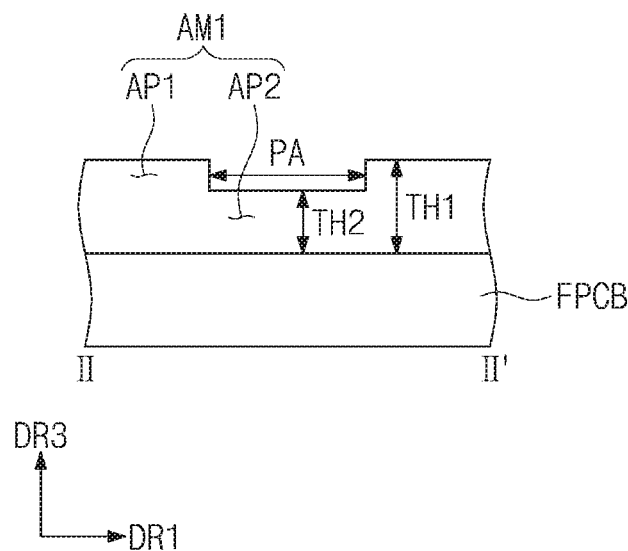
FIGS. 3G and 3H are cross-sectional views illustrating an adhesive member according to embodiments of the inventive concept, taken along the line II-II' of FIG. 3F.
Figure 3H:
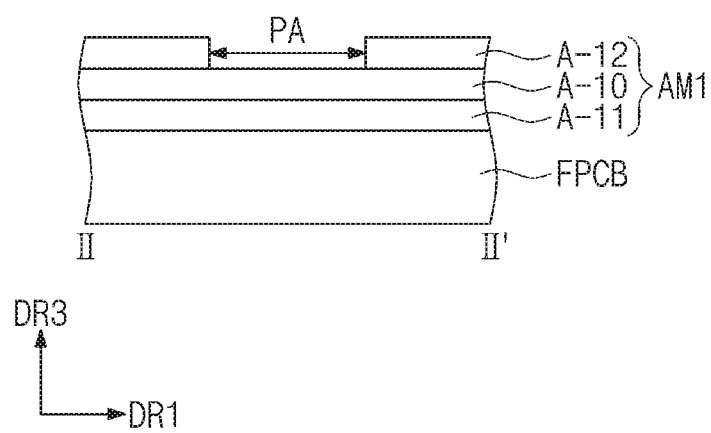
Figure 3I:
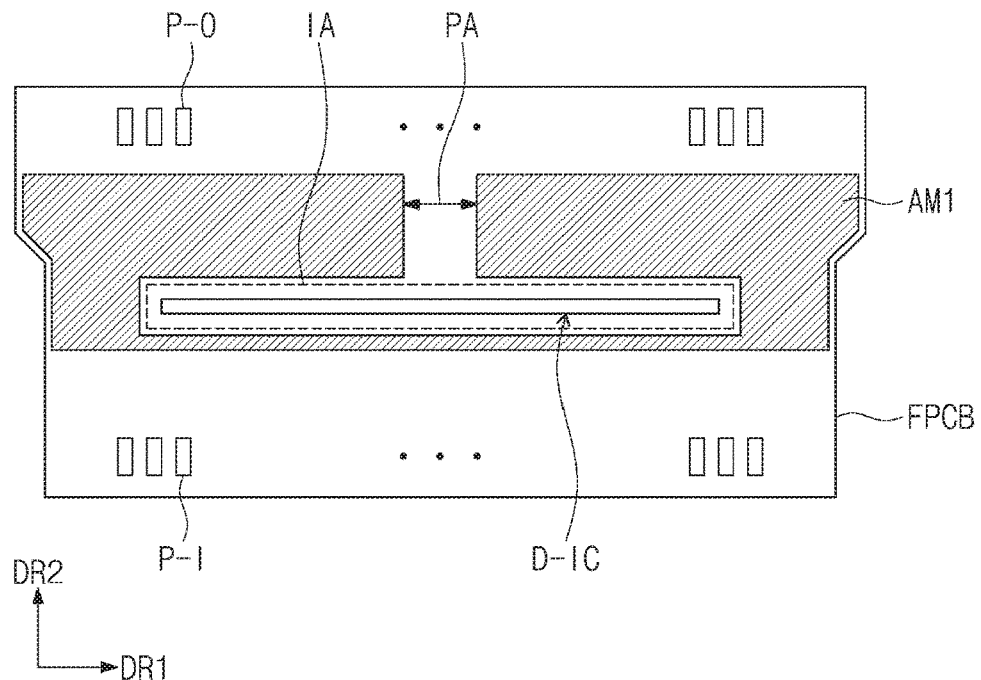
FIG. 3I is a plan view illustrating a circuit board according to an embodiment of the inventive concept.
Figure 3J:
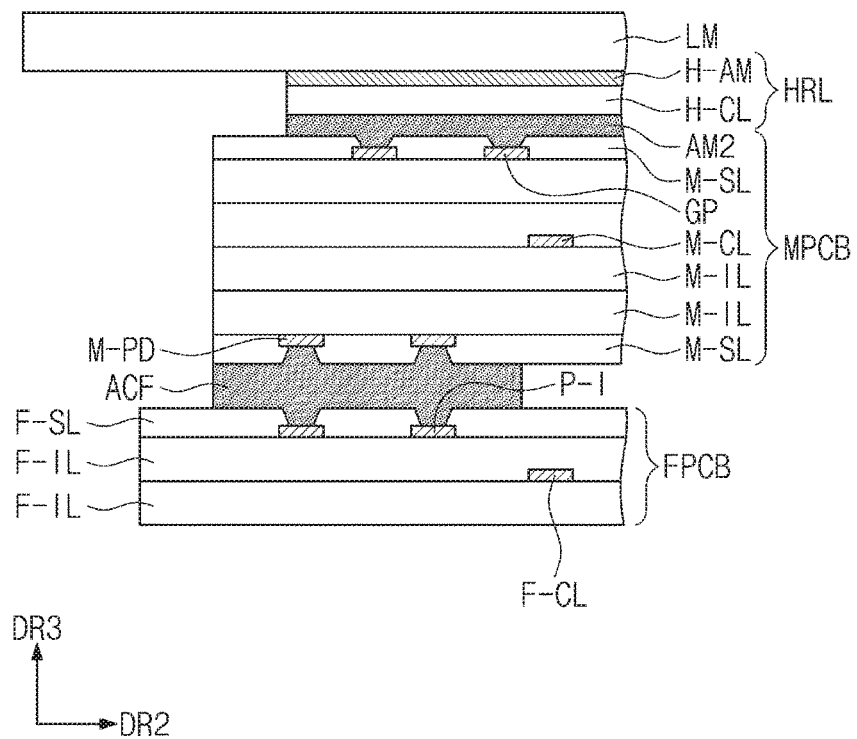
FIG. 3J is an enlarged cross-sectional view illustrating a portion of a display device according to an embodiment of the inventive concept.

FIG. 3A is an exploded perspective view illustrating the display device DD according to an embodiment of the inventive concept; FIG. 3B is a rear view illustrating the display device DD according to an embodiment of the inventive concept; FIG. 3C is a cross-sectional view illustrating a lower member or lower layer LM according to an embodiment of the inventive concept; FIGS. 3D and 3E are cross-sectional views illustrating the display device DD according to an embodiment of the inventive concept; FIG. 3F is a plan view illustrating a circuit board FPCB according to an embodiment of the inventive concept; FIGS. 3G and 3H are cross-sectional views illustrating an adhesive member or adhesive layer AM1 according to embodiments of the inventive concept, taken along the line II-II' of FIG. 3F; FIG. 3I is a plan view illustrating the circuit board FPCB according to an embodiment of the inventive concept; and FIG. 3J is an enlarged cross-sectional illustrating a portion of the display device DD according to an embodiment of the inventive concept.

As shown in FIGS. 3A to 3J, the display device DD may include the window WM and the display module DM. The window WM may include a base structure BS and a bezel layer BZL disposed on a rear surface of the base structure BS. A region disposed with the bezel layer BZL may be defined as the bezel region BZA of FIGS. 1A and 1B. Although, in the present embodiment, the window WM is illustrated to have a flat shape in the display region DA, the shape of the window WM may be varied. In an embodiment, the window WM may have curved edges, which face each other in the first direction DR1.

The base structure BS may include any of a glass substrate, a sapphire substrate, a plastic substrate, and so forth. The base structure BS may have a single- or multi-layered structure. For example, the base structure BS may include a plurality of plastic films, which are combined to each other by an adhesive element. The base structure BS may include a glass substrate and a plastic film, which is combined to the glass substrate by an adhesive element.

The bezel layer BZL may have a single- or multi-layered structure. In the case of the multi-layered structure, the bezel layer BZL may include a buffer layer having a good adhesive property, a patterned layer displaying a specific pattern, and an achromatic layer. The patterned layer may be configured to display a pattern called a hairline. The achromatic layer may include a black pigment or a dye-containing organic mixture. Each of the layers may be formed by a deposition, printing, or coating method. Although not shown, the window WM may further include a functional coating layer disposed on the front surface of the base structure BS. The functional coating layer may include any of an anti-fingerprint layer, an anti-reflection layer, a hard coating layer, and so forth.

As shown in FIGS. 3A to 3J, in an embodiment, the display module DM may include a display panel DP, an anti-reflection unit ARU, an input detection sensor ISU, a lower member LM, a driving control module DCM, and a heat radiation member or heat radiation layer HRL. At least one transparent adhesive member may be formed between the above components of the display module DM (e.g., between the anti-reflection unit ARU and the input detection sensor ISU), although not illustrated in FIG. 3A for convenience in illustration. The transparent adhesive member may be a pressure sensitive adhesive (PSA) film, an optically clear adhesive (OCA) film, or an optically clear resin (OCR) film.

As shown in FIG. 3A, the display panel DP may include a display substrate AP and an encapsulation substrate EP. In an embodiment, the display panel DP may be an organic light emitting display panel. When viewed in a plan view, the display panel DP may include a pixel region PXA, in which a pixel PX is disposed, and a non-pixel region NPXA, which is disposed adjacent to the pixel region PXA. Peripheral components, such as signal lines and banks, but not the pixel PX, may be disposed on the non-pixel region NPXA. The pixel region PXA and the non-pixel region NPXA may correspond to the display region DA and the bezel region BZA, respectively, of FIG. 1A. However, the corresponding regions may not necessarily be identical in terms of, for example, shape, area, and so forth.

The pixel PX may be disposed in the pixel region PXA. In an embodiment, a plurality of the pixel PX may be connected to each of signal lines. The pixel PX may include a first thin film transistor TR1, a second thin film transistor TR2, a capacitor CP, and a light-emitting device ELD.

The first thin film transistor TR1 may be connected to a gate line GL and a data line DL. The light-emitting device ELD may receive a power voltage disposed through a power line PL. Pads PDD, which are connected to signal lines (e.g., the data line DL and the power line PL), may be disposed in the non-pixel region NPXA. The pad PDD may be connected to the signal line to constitute a single object, but, in an embodiment, the pad PDD may be disposed at a level different from the signal line and may be connected to an end portion of the signal line through a contact hole penetrating an insulating layer. In an embodiment, the pads PDD may not be overlapped with the encapsulation substrate EP.

The anti-reflection unit ARU may include a polarizer and a phase retarder. For example, the anti-reflection unit ARU may include an elongated film type polarizer and/or an elongated film type phase retarder. The number and the phase retardation length (e.g., A/4 or A/2) of the phase retardation film may be determined depending on an operation principle of the anti-reflection unit ARU. The anti-reflection unit ARU may include a base film and a liquid crystal layer coated on the base film. According to optical characteristics of the liquid crystal layer, the anti-reflection unit ARU may be used as a polarizer or a phase retarder. The anti-reflection unit ARU may include color filters.

The input detection sensor ISU may be configured to obtain information on coordinates of an external input. The input detection sensor ISU may be configured to sense various inputs from the outside of the electronic device ED. For example, the input detection sensor ISU may be configured to sense an input by a user's body or to sense various external inputs, such as light, heat, or pressure. In addition, the input detection sensor ISU may be configured to sense an input that is in contact with or close to a sensing surface.

The input detection sensor ISU may be, for example, any of a capacitive touch panel, an inductive touch panel, and so forth. The touch panel may include a base layer, touch sensor electrodes, and signal lines connected to the touch sensor electrodes. The touch panel may include a region in which the touch sensor electrodes are disposed, and another region in which the touch sensor electrodes are not disposed, when viewed in a plan view. The region on which the touch sensor electrodes are disposed may correspond to the pixel region PXA. The input detection sensor ISU may be coupled to a second circuit board MPCB, which will be described below, through a flexible circuit board I-PCB. A driving chip (not shown) of the input detection sensor ISU may be mounted on the flexible circuit board I-PCB.

As shown in FIGS. 3A to 3C, the lower member LM may be disposed on a rear surface of the display panel DP to support the display panel DP. As shown in FIG. 3C, the lower member LM may have a multi-layered structure. The lower member LM may include a light-blocking member or light-blocking layer LBL and an elastic member or elastic layer EL. The light-blocking member LBL may prevent or substantially prevent an external light from passing into the display panel DP through a rear surface of the display panel DP. In an embodiment, the light-blocking member LBL may be a black synthetic resin (e.g., a black PET film).

Adhesive layers L-AM may be respectively disposed on opposite surfaces of the light-blocking member LBL, and, in this case, the light-blocking member LBL may have a structure similar to a double-sided adhesive tape. Thus, the light-blocking member LBL may be used as an adhesive tape attaching the elastic member EL to a lower surface of the display panel DP. In an embodiment, fine patterns (e.g., protrusions and/or grooves) may be disposed on a surface of the light-blocking member LBL, and bubbles, which may be produced between the elastic member EL and the display panel DP, may be exhausted to the outside through the fine patterns. That is, the fine pattern may prevent or substantially prevent the bubbles from being collected in a region between the elastic member EL and the display panel DP.

The elastic member EL may be configured to absorb an external impact and to protect the display panel DP from the external impact. In an embodiment, the elastic member EL may include a foam synthetic resin (e.g., a foam urethane sheet).

In addition, the lower member LM may further include a metal plate whose stiffness is higher than a reference value (e.g., a predetermined reference value). In an embodiment, the lower member LM may be a stainless steel plate. In an embodiment, the lower member LM may be omitted.

The driving control module DCM may include the first circuit board FPCB connected to the display panel DP, the second circuit board MPCB connected to the first circuit board FPCB, and a driving chip D-IC mounted on the first circuit board FPCB. The driving chip D-IC may be configured to provide various signals, such as data signals, gate signals, and/or control signals, to the display panel DP.

Although not shown, a plurality of passive devices and a plurality of active devices may be mounted on the second circuit board MPCB. For example, the second circuit board MPCB may be a rigid or flexible circuit board, and the first circuit board FPCB may be a flexible circuit board.

Although not shown, the second circuit board MPCB may be electrically connected to the motherboard of the electronic module EM (e.g., see FIG. 1B) through an electric connector.

The heat radiation member HRL may absorb heat generated in the driving chip D-IC and may dissipate the heat in an outward direction when viewed in a plan view. Thus, a heat radiation efficiency may be improved. The heat radiation member HRL may be formed of or include a layer or material having a thermal conductivity higher than 200 W/mK. As shown in FIGS. 3A and 3B, the heat radiation member HRL may be overlapped with a portion of the lower member LM.

In the present embodiment, the heat radiation member HRL may be formed of or include a metal layer. In an embodiment, the metal layer may include copper, gold, silver, or aluminum. However, the inventive concept is not limited to the above examples of the heat radiation member HRL. For example, the heat radiation member HRL may be formed of or include a non-metallic conductive layer or a graphite layer.

Although the display module DM is illustrated to have both of the input detection sensor ISU and the anti-reflection unit ARU, at least one of the input detection sensor ISU and the anti-reflection unit ARU may be omitted from the display module DM. In an embodiment, at least one of the input detection sensor ISU and the anti-reflection unit ARU may be integrated on the display panel DP (for example, by a successive process).

Although not shown, the display module DM may further include a pressure-sensing unit that is disposed on a lower surface of the lower member LM. The pressure-sensing unit may be disposed on a rear surface of the display module and may be used to sense an external pressure applied to the display module. In an embodiment, the pressure-sensing unit may include a base layer, piezo-electric devices, and signal lines connected to the piezo-electric devices.

Herein, the display module DM will be described in further detail with reference to FIGS. 3D to 3J. As shown in FIGS. 3D and 3E, the first circuit board FPCB may be deformed from an unfolded shape to a bent shape, such that the first circuit board FPCB is coupled to the heat radiation member HRL. The first circuit board FPCB and the adhesive member AM1 shown in FIG. 3E correspond to cross-sections taken along line I-I' of FIG. 3F. The first circuit board FPCB may be coupled to the heat radiation member HRL by the first adhesive member AM1. The second circuit board MPCB may be coupled to the heat radiation member HRL by a second adhesive member AM2. At least one of the first and second adhesive members AM1 and AM2 may be a transparent adhesive member, such as a pressure sensitive adhesive (PSA) film, an optically clear adhesive (OCA) film, or an optically clear resin (OCR) film. The first and second adhesive members AM1 and AM2 may include a typical adhesive sheet. The typical adhesive sheet may include a base film and adhesive layers, which are disposed on two opposite surfaces of the base film. At least one of the first and second adhesive members AM1 and AM2 may include a conductive adhesive sheet.

The first adhesive member AM1 may be thicker than the second adhesive member AM2. When viewed in a plan view, the first adhesive member AM1 may have an area that is smaller than that of the second adhesive member AM2.

As shown in FIGS. 3D to 3F, the first circuit board FPCB may include a first portion P1, which is overlapped with the pad PDD of the signal line (e.g., see FIG. 3A), a second portion P2, which is extended from the first portion P1 and has a curvature, and a third portion P3, which is extended from the second portion P2. The driving chip D-IC may be mounted on the third portion P3 overlapped with the lower member LM. The first adhesive member AM1 may be disposed on the third portion P3.

The first circuit board FPCB may include at least one insulating layer and at least one conductive layer. The conductive layer may include conductive patterns (e.g., signal lines). Signal lines of the circuit board and signal lines of the display panel DP may be connected to each other through a conductive connecting member (e.g., an anisotropic conductive film). In an embodiment, the anisotropic conductive film may be replaced with a solder paste, solder balls, or solder bumps.

FIG. 3F illustrates the first circuit board FPCB in an unfolded state. An input pad P-I and an output pad P-O may be disposed on a surface of the first circuit board FPCB and may be exposed to an outside of the first circuit board FPCB.

In an embodiment, on the surface of the first circuit board FPCB, the first adhesive member AM1 may be disposed to enclose most of the driving chip D-IC. The first adhesive member AM1 may define an internal region IA, in which the driving chip D-IC is disposed, and a passage region PA, which connects the internal region IA to an outer region of the first adhesive member AM1.

As shown in FIG. 3E, the first adhesive member AM1 may maintain a coupling strength between the first circuit board FPCB and the heat radiation member HRL while maintaining a distance between the first circuit board FPCB and the heat radiation member HRL. The adhesive member AM1 may provide the passage region PA, which prevents the driving chip D-IC from being completely sealed by the first circuit board FPCB, the heat radiation member HRL, and the first adhesive member AM1. Heat generated in the driving chip D-IC may be dissipated to the outer space of the first adhesive member AM1 through the passage region PA. Since heat generated in the driving chip D-IC is efficiently dissipated, the driving chip D-IC may be prevented or substantially prevented from being thermally damaged. In an embodiment, a width of the passage region PA in the first direction DR1 may be 5% to 20% of a length of the driving chip D-IC in the first direction DR1. If the width of the passage region PA is excessively large, a pressure may be exerted on the region concerned, and, in this case, a crack may occur in the first circuit board FPCB.

In the case in which the width of the passage region PA is too large, an area of a region on which the first adhesive member AM1 is disposed may be reduced. Accordingly, a coupling strength between the first circuit board FPCB and the heat radiation member HRL may be reduced. In the case in which the width of the passage region PA is too small, a size of a heat radiation passage may be reduced, such that the driving chip D-IC may be thermally damaged.

As shown in FIGS. 3F and 3G, the first adhesive member AM1 may include a first portion AP1 and a second portion AP2 whose thicknesses are different from each other. The second portion AP2 may be a region corresponding to the passage region PA and may have a second thickness TH2 smaller than a first thickness TH1 of the first portion AP1. In an embodiment, a thickness of the second portion AP2 may not be constant. The first portion AP1 and the second portion AP2 may be continuously connected to form a closed line when viewed in a plan view.

In an embodiment, the second thickness TH2 may be 70% to 92% of the first thickness TH1. In the present embodiment, a length of the second portion AP2 in the first direction DR1 may be 5% to 20% of the length of the driving chip D-IC in the first direction DR1. If a difference between the first thickness TH1 and the second thickness TH2 is too large or a length of the second portion AP2 is too large, a crack may occur in the first circuit board FPCB when a pressure is applied to the passage region PA. As shown in FIG. 3H, in an embodiment, the first adhesive member AM1 may have a multi-layered structure. The first adhesive member AM1 may include a base film A-10 and upper and lower adhesive layers A-11 and A-12, which are respectively disposed on two opposite surfaces of the base film A-10. The base film A-10 may be a typical synthetic resin film, and the adhesive layers A-11 and A-12 may include a typical binder. In the passage region PA, a portion of the upper adhesive layer A-12 may be removed or absent. In an embodiment, a thickness of the upper adhesive layer A-12 may be 8% to 30% of a thickness of the first adhesive member AM1. In the present embodiment, a length of a portion corresponding to the passage region PA in the first direction DR1 may be 5% to 20% of the length of the driving chip D-IC in the first direction DR1. In an embodiment, the lower adhesive layer A-11 may be removed or absent from a region corresponding to the passage region PA, or the lower adhesive layer A-11 may be further removed from a region corresponding to the passage region PA.

As shown in FIG. 3I, in an embodiment, the passage region PA may be defined as a region in which the first adhesive member AM1 is not disposed.

FIG. 3J illustrates a coupling structure (herein, a first coupling structure) between the second circuit board MPCB and the heat radiation member HRL. In addition, a coupling structure (herein, a second coupling structure) between the first circuit board FPCB and the second circuit board MPCB is illustrated. For convenience in illustration, the first coupling structure and the second coupling structure are illustrated in FIG. 3J showing a single section, but the first coupling structure and the second coupling structure may be placed at different regions, when viewed in a plan view.

In the present embodiment, the heat radiation member HRL may include a metal layer H-CL. The heat radiation member HRL may be a metal adhesive sheet including the metal layer H-CL and an adhesive layer H-AM. The metal layer H-CL may be electrically connected to a ground pad GP of the second circuit board MPCB through the second adhesive member AM2. The ground pad GP may be connected to a ground pattern of an electronic component, which is mounted on the second circuit board MPCB, through a signal line. In the present embodiment, the second adhesive member AM2 may be an anisotropic conductive film. The metal layer H-CL may be used as a ground layer of the second circuit board MPCB.

In the present embodiment, the second circuit board MPCB including four insulating layers M-IL, a signal line M-CL, a coupling pad M-PD, and a solder resist layer M-SL is exemplarily illustrated, but the inventive concept is not limited to such a structure of the second circuit board MPCB.

The input pad P-I of the first circuit board FPCB and the coupling pad M-PD of the second circuit board MPCB may also be coupled to each other by an anisotropic conductive film ACF. In the present embodiment, the first circuit board FPCB including two insulating layers F-IL, a signal line F-CL, the input pad P-I, and a solder resist layer F-SL is exemplarily illustrated, but the inventive concept is not limited to such a structure of the first circuit board FPCB.

The above description of the display device DD of FIGS. 3A to 3J refers to an example in which the heat radiation passage PA is disposed by the first adhesive member AM1 attaching the first circuit board FPCB to the heat radiation member HRL, but the inventive concept is not limited to this example. In an embodiment, the first adhesive member AM1 may be replaced with a spacer maintaining a distance between the heat radiation member HRL and the first circuit board FPCB. The spacer may be attached to either of the heat radiation member HRL and the first circuit board FPCB. Here, the first circuit board FPCB may be fastened to a rear surface of the display panel DP by the second circuit board MPCB and the second adhesive member AM2.

Figure 4A:
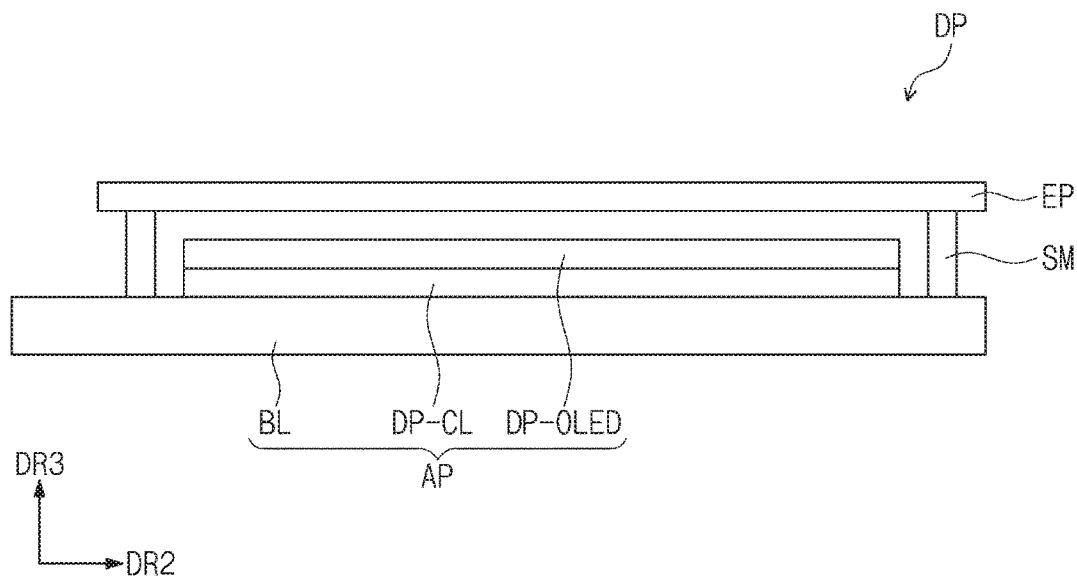
FIG. 4A is a cross-sectional view illustrating a display panel according to an embodiment of the inventive concept.
Figure 4B:
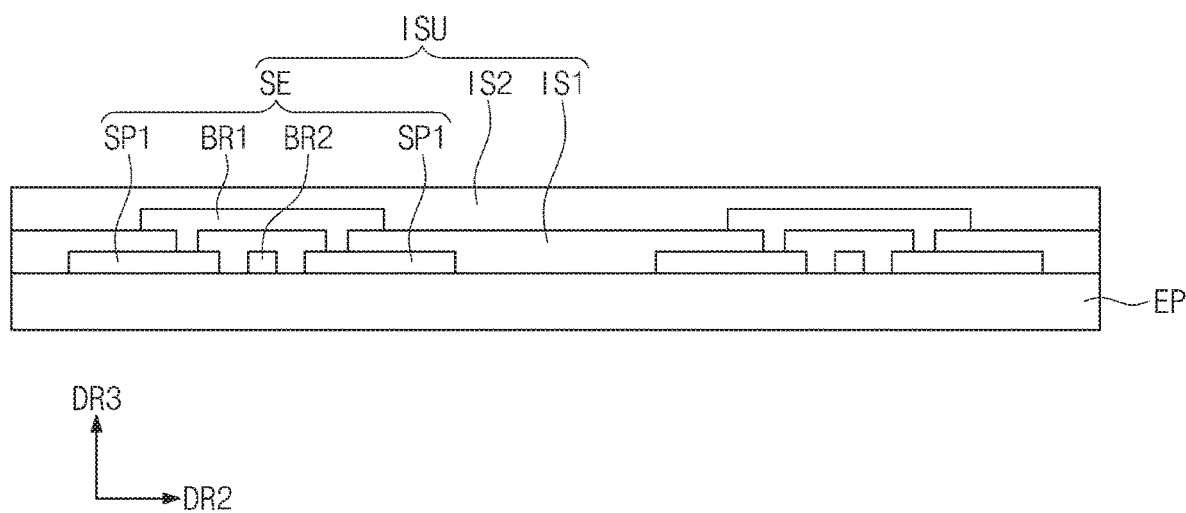
FIG. 4B is a cross-sectional view illustrating an input detection sensor according to an embodiment of the inventive concept.

FIG. 4A is a cross-sectional view illustrating the display panel DP according to an embodiment of the inventive concept; and FIG. 4B is a cross-sectional view illustrating the input detection sensor ISU according to an embodiment of the inventive concept.

As shown in FIG. 4A, the display panel DP may include the display substrate AP, the encapsulation substrate EP, and a sealing member SM coupling the display substrate AP and the encapsulation substrate EP to each other. In the present embodiment, the display panel DP may be a rigid-type display panel.

The display substrate AP may include a base layer BL, and a circuit device layer DP-CL and a display device layer DP-OLED which are disposed on the base layer BL. Although not shown, the display panel DP may further include functional layers such as a refractive index controlling layer.

The base layer BL may include a synthetic resin substrate or a glass substrate. In an embodiment, the base layer BL may include a metal substrate or an organic/inorganic composite material substrate.

The circuit device layer DP-CL may include at least one insulating layer and at least one circuit device. The insulating layer may include at least one intermediate inorganic layer and/or at least one intermediate organic layer. The circuit device may include signal lines, pixel driving circuits, and so forth. The pixel driving circuits may include the transistors TR1 and TR2 and the capacitor CP described with reference to FIG. 3A. The formation of the circuit device layer DP-CL may include forming an insulating layer, a semiconductor layer, and a conductive layer using a coating or deposition process and patterning the insulating layer, the semiconductor layer, and the conductive layer using a photolithography and etching process.

The display device layer DP-OLED may include the light-emitting device ELD described with reference to FIG. 3A. In an embodiment, the light-emitting device ELD may include an organic light emitting diode or a quantum dot light-emitting diode. The display device layer DP-OLED may further include an organic layer such as a pixel definition layer.

The encapsulation substrate EP may include a synthetic resin substrate or a glass substrate. The sealing member SM may include an inorganic material adhesive member (e.g., frit). However, the inventive concept is not limited thereto, and, in an embodiment, the sealing member SM may include an organic material adhesive member. In the present embodiment, the display panel DP may be hermetically sealed from the outer space, and, thus, the light-emitting device may be prevented or substantially prevented from failing due to moisture.

As shown in FIG. 4B, in an embodiment, the input detection sensor ISU may be directly disposed on a base surface, which is disposed by the encapsulation substrate EP. In the present specification, the expression "an element B may be directly disposed on an element A" means that an adhesive layer/member is not disposed between the elements A and B.

The input detection sensor ISU may include at least a sensor electrode SE. In the present embodiment, the input detection sensor ISU may further include insulating layers IS1 and IS2. Although not shown, in an embodiment, the input detection sensor ISU may further include signal lines connected to the sensor electrode SE.

In the present embodiment, the input detection sensor ISU may be a double-layered capacitive-type touch panel. The input detection sensor ISU comprises first sensing electrodes, first signal lines connected to the first sensing electrodes, second sensing electrodes, and second signal lines connected to the second sensing electrodes. The first sensing electrodes may cross the second sensing electrodes. Each of first sensing electrodes includes sensor portions and connecting portions.

The input detection sensor ISU may include a sensor portion SP1 of a first sensor electrode, a sensor portion (not shown) of a second sensor electrode, and a connecting portion BR1, which are disposed on an upper surface of the encapsulation substrate EP. The sensor portion SP1 of the first sensor electrode may be in contact with the upper surface of the encapsulation substrate EP or may be disposed on an insulating layer disposed on the upper surface of the encapsulation substrate EP.

A first insulating layer IS1 may be disposed on the upper surface of the encapsulation substrate EP, and the connecting portion BR1 of the first sensor electrode may be disposed on the first insulating layer IS1. The sensor portion SP1 of the first sensor electrode and the connecting portion BR1 may be connected to each other through a contact hole penetrating the first insulating layer IS1. In the case in which the sensor portion SP1 of the first sensor electrode is connected to the connecting portion BR1 and the first sensor electrode is extended in the second direction DR2, the sensor portion (not shown) of the second sensor electrode may be connected to a connecting portion BR2 and the second sensor electrode may be extended in the first direction. A second insulating layer IS2 may be disposed on the first insulating layer IS1 to cover the connecting portion BR2.

Figure 5A:
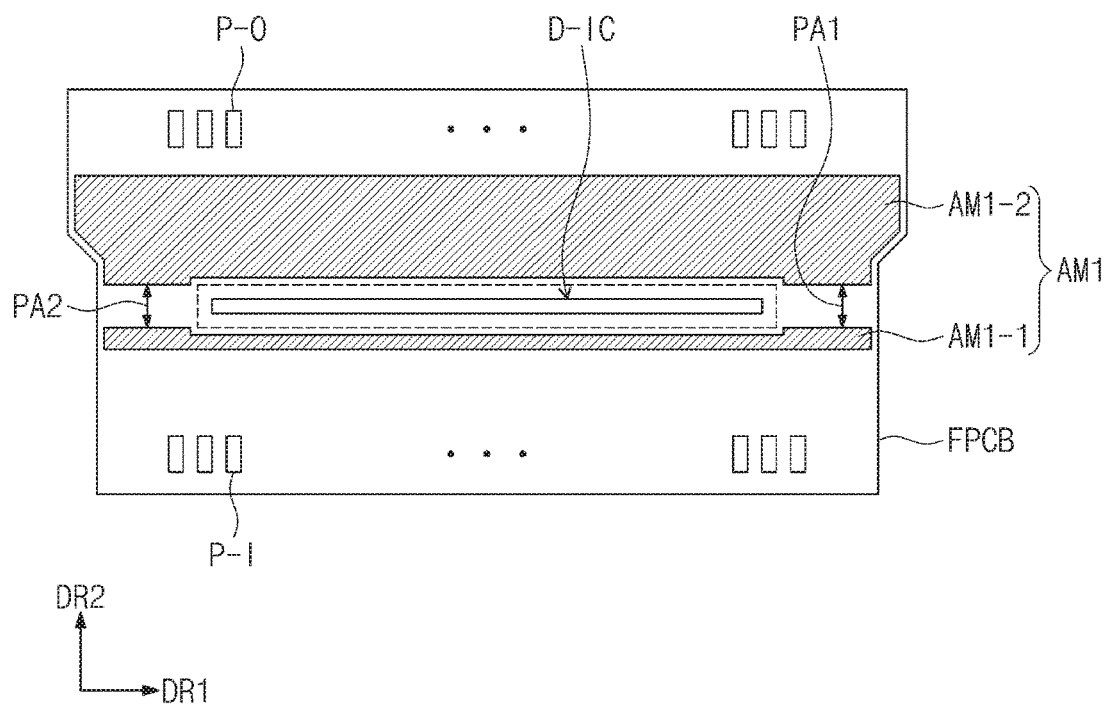
FIGS. 5A and 5B are plan views illustrating a circuit board according to embodiments of the inventive concept.
Figure 5B:
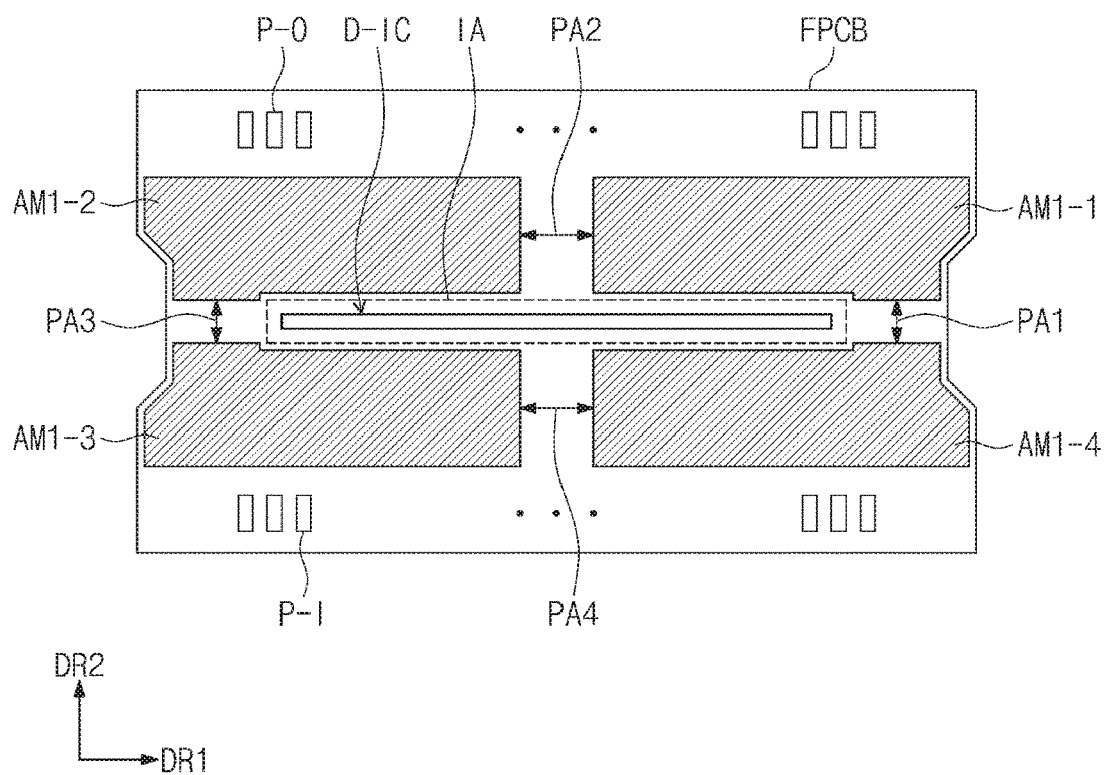

FIGS. 5A and 5B are plan views illustrating the first circuit board FPCB according to embodiments of the inventive concept. For concise description, an element previously described with reference to FIGS. 1 to 4B may be identified by the same reference number without repeating an overlapping description thereof. Herein, the first adhesive member AM1 is illustrated as the first adhesive member described with reference to FIG. 3I, but, in an embodiment, the first adhesive member AM1 may be the first adhesive member described with reference to FIGS. 3F to 3H.

As shown in FIG. 5A, the first adhesive member AM1 may include a plurality of adhesion portions AM1-1 and AM1-2. A first adhesion portion AM1-1 and a second adhesion portion AM1-2 may be spaced apart from each other in the second direction DR2. A first passage region PA1 and a second passage region PA2 may be defined between the first adhesion portion AM1-1 and the second adhesion portion AM1-2.

The first passage region PA1 and the second passage region PA2 may be disposed at both sides of the driving chip D-IC in the first direction DR1. In an embodiment, widths of the first passage region PA1 and the second passage region PA2 in the second direction DR2 may be 5% to 20% of the length of the driving chip D-IC in the first direction DR1.

As shown in FIG. 5B, the first adhesive member AM1 may include first to fourth adhesion portions AM1-1 to AM1-4. First to fourth passage regions PA1 to PA4 may be defined between the first to fourth adhesion portions AM1-1 to AM1-4. In an embodiment, a sum of widths of the first and third passage regions PA1 and PA3 in the second direction DR2 and widths of the second and fourth passage regions PA2 and PA4 in the first direction DR1 may be 5% to 20% of the length of the driving chip D-IC in the first direction DR1.

In one or more embodiments, an area of the passage region and an area of the adhesion portion may be varied in consideration of a heat radiation property and an adhesion property.

Figure 6A:
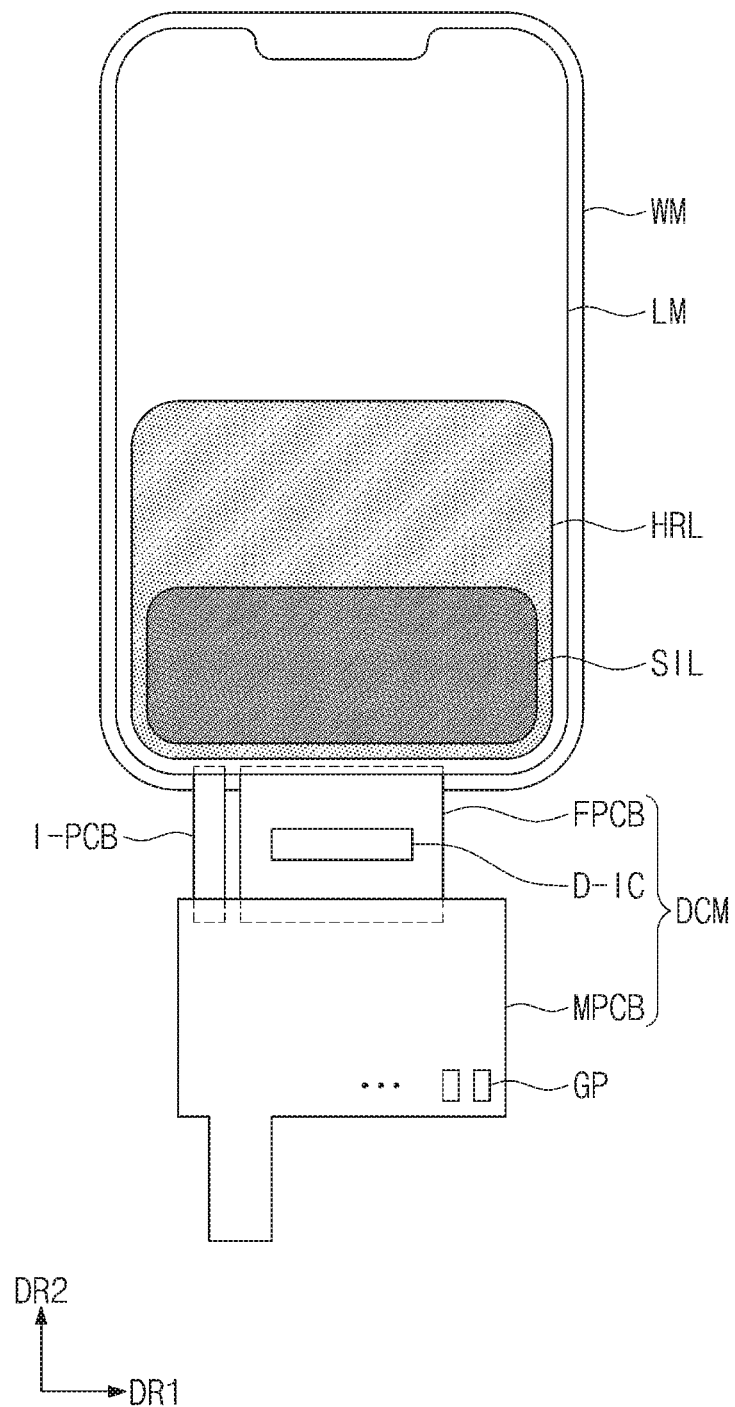
FIG. 6A is a rear view illustrating a display device according to an embodiment of the inventive concept.
Figure 6B:
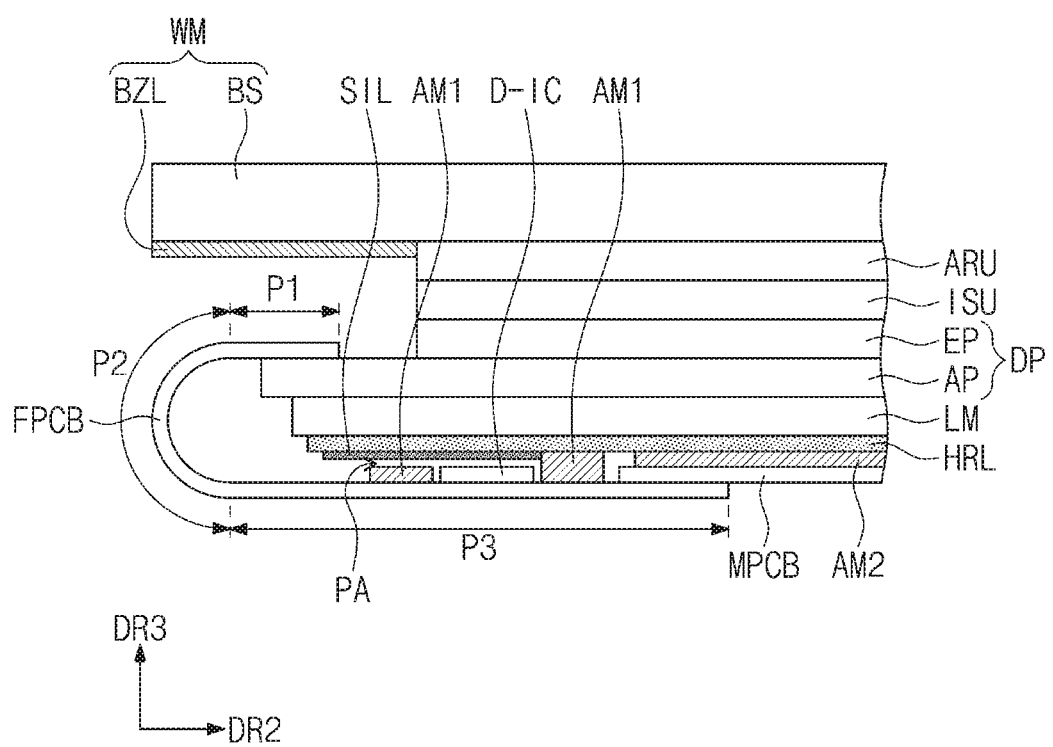
FIG. 6B is a cross-sectional view illustrating a display device according to an embodiment of the inventive concept.

FIG. 6A is a rear view illustrating the display device DD according to an embodiment of the inventive concept; and FIG. 6B is a cross-sectional view illustrating the display device DD according to an embodiment of the inventive concept. For concise description, an element previously described with reference to FIGS. 1 to 5B may be identified by the same reference number without repeating an overlapping description thereof.

In the present embodiment, the display device DD may further include an insulating member SIL disposed on a lower surface of the heat radiation member HRL. Accordingly, it may be possible to electrically disconnect the heat radiation member HRL, which includes a metal layer, from the driving chip D-IC, and, thus, a short circuit may be prevented or substantially prevented from being formed between the heat radiation member HRL and the driving chip D-IC. The insulating member SIL may include an electrical insulating tape. The electrical insulating tape may include a synthetic resin layer having a high insulating property and an adhesive layer.

In FIG. 6B, the first adhesive member AM1 is illustrated to be attached to lower surfaces of the insulating member SIL and the heat radiation member HRL. In an embodiment, the entirety of the first adhesive member AM1 may be attached to a lower surface of the insulating member SIL. The insulating member SIL may be overlapped with a portion of the heat radiation member HRL. In an embodiment, when viewed in a plan view, the insulating member SIL may have an area larger than that of the driving chip D-IC. Although not shown, the driving chip D-IC may be disposed within the insulating member SIL in a plan view.

Figure 7A:
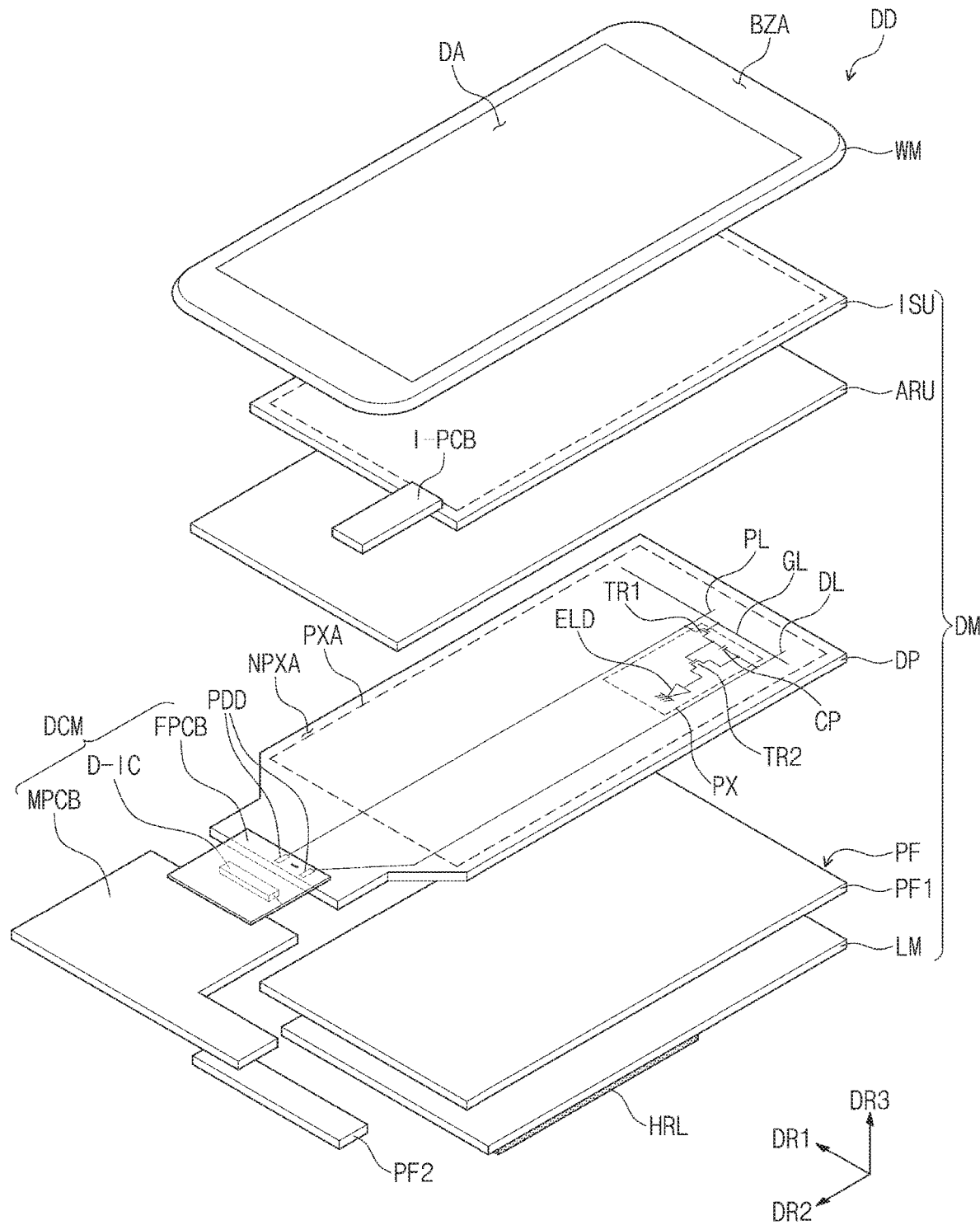
FIG. 7A is an exploded perspective view illustrating a display device according to an embodiment of the inventive concept.
Figure 7B:
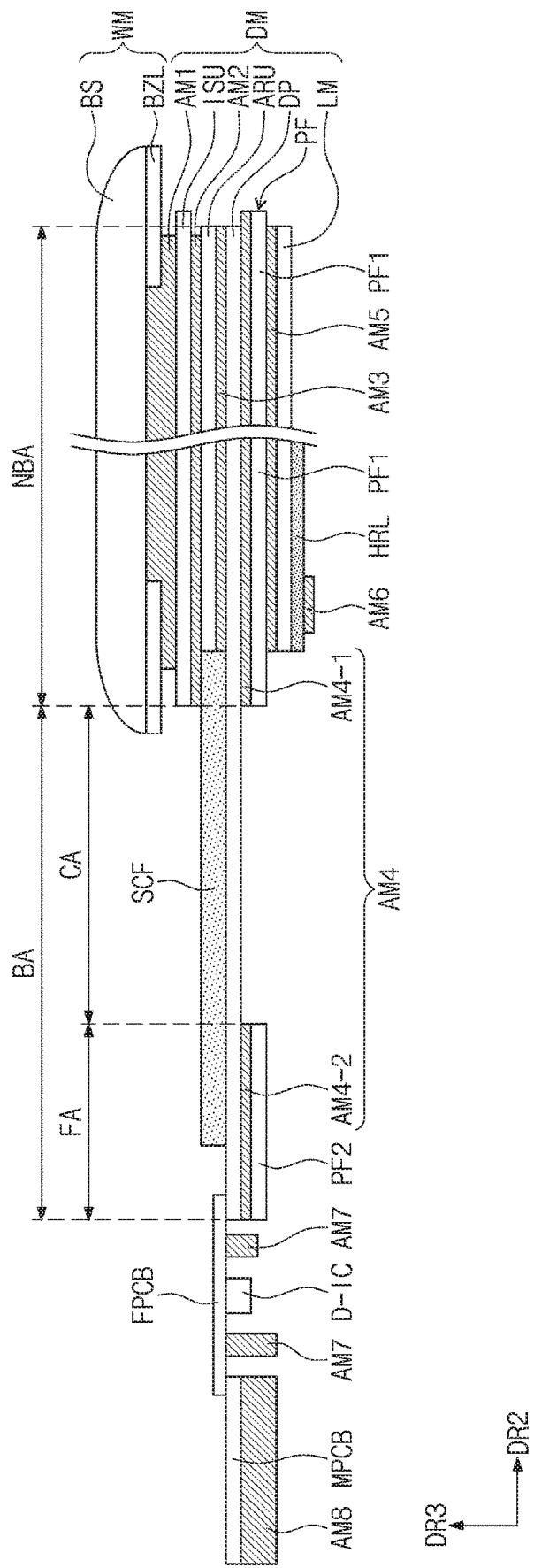

FIG. 7A is a perspective view illustrating the display device DD according to an embodiment of the inventive concept; and FIGS. 7B and 7C are cross-sectional views illustrating the display device DD according to an embodiment of the inventive concept. For concise description, an element previously described with reference to FIGS. 1 to 6B may be identified by the same reference number without repeating an overlapping description thereof.

In the present embodiment, unlike the display device DD shown in FIG. 3A, the input detection sensor ISU may be disposed on the anti-reflection unit ARU. The anti-reflection unit ARU may be coupled to the display panel DP by a third adhesive member AM3. Further, in the present embodiment, shapes of some members may be different from corresponding members of FIG. 3A.

The display panel DP may be a flexible-type display panel. The display panel DP may not include the encapsulation substrate EP and the sealing member SM, unlike the display panel DP shown in FIG. 4A. When compared with the display panel DP shown in FIG. 4A, the display panel DP according to the present embodiment may include the base layer BL having a flexible property and the circuit device layer DP-CL, the display device layer DP-OLED, and a thin encapsulation layer on the base layer BL. The base layer BL may include a synthetic resin film (e.g., poly imide or poly amide). The thin encapsulation layer may include an organic thin film and an inorganic thin film.

A portion of the display panel DP may be bent. Since the display panel DP is bent, the display panel DP may include a non-bending region NBA and a bending or first region BA. The bending region BA may include a curvature or second region CA having a curvature (e.g., a specific curvature) and a facing or third region FA facing the non-bending region NBA when the display panel DP is in the bent state. When the display panel DP is in the bent state, the bending region BA may be bent with a curvature radius (e.g., a specific curvature radius) about a bending axis BX.

A base layer BL (e.g., see FIG. 4A) and a circuit device layer DP-CL (e.g., see FIG. 4A) may be disposed corresponding to the non-bending region NBA and the bending region BA. The display device layer DP-OLED (e.g., see FIG. 4A) and the thin encapsulation layer may be disposed on the non-bending region NBA.

The display panel DP may be coupled to a protection film PF by a fourth adhesive member AM4. The protection film PF may include a first protection film PF1 and a second protection film PF2 spaced apart from each other. The fourth adhesive member AM4 may include a first adhesion portion AM4-1 and a second adhesion portion AM4-2, which correspond to the first protection film PF1 and the second protection film PF2, respectively.

The non-bending region NBA and the first protection film PF1 may be coupled to each other by the first adhesion portion AM4-1. The facing region FA and the second protection film PF2 may be coupled to each other by the second adhesion portion AM4-2. When the display panel DP is in the bent state, the first protection film PF1 and the second protection film PF2 may be spaced apart from each other with the curvature region CA interposed therebetween.

The first protection film PF1 and the lower member LM may be coupled to each other by a fifth adhesive member AM5.

When the display panel DP is in the bent state, the second protection film PF2 and the heat radiation member HRL may be coupled to each other by a sixth adhesive member AM6. The first circuit board FPCB and the heat radiation member HRL may be coupled to each other by a seventh adhesive member AM7. The seventh adhesive member AM7 may correspond to the first adhesive member AM1 of FIG. 3F. The second circuit board MPCB and the heat radiation member HRL may be coupled to each other by an eighth adhesive member AM8.

The display panel DP may further include a stress control film SCF, which is disposed on the circuit device layer to correspond to at least the curvature region CA. In an embodiment, the stress control film SCF may be disposed such that a portion of the stress control film SCF, an area of which is larger than 70% of the total area, covers the curvature region CA. The stress control film SCF may be partially overlapped with the non-bending region NBA and the facing region FA. In an embodiment, the stress control film SCF may include a synthetic resin film, as in the protection film PF.

Each of the protection film PF and the fourth adhesive element AM4 has been described to include two portions, but, in one or more embodiments, each of the protection film PF and the fourth adhesive element AM4 may have a slit that is disposed at a region corresponding to the curvature region CA.

According to an aspect of embodiments of the inventive concept, a heat radiation passage may be formed in an adhesive member to efficiently exhaust heat, which is generated in a driving chip, to an outside.

A heat radiation member (e.g., a metal layer) may be disposed on a lower member to absorb and dissipate heat generated in the driving chip. Thus, a heat radiation efficiency can be improved. A ground pattern of a circuit board may be electrically connected to the metal layer, and, thus, the metal layer may be used as a ground layer of the circuit board.

An insulating layer may be disposed between the conductive layer and the driving chip to prevent or substantially prevent a short circuit from being formed between the conductive layer and the driving chip.

While some example embodiments of the inventive concept have been particularly shown and described, it will be understood by one of ordinary skill in the art that variations in form and detail may be made therein without departing from the spirit and scope of the attached claims.

What is claimed is:

1. A display device, comprising:
   a window; and
   a display module under the window,
   wherein the display module comprises:
   a display panel comprising a display substrate comprising a base layer, a pixel on the base layer, a signal line on the base layer, and a pad connected to the signal line;
   a lower member under the display panel;
   a heat radiation member under the lower member,
   a first circuit board overlapped with and electrically connected to the pad and overlapped with the heat radiation member;
   a driving chip on the first circuit board and located between the first circuit board and the heat radiation member; and
   an adhesive member coupling the first circuit board to the heat radiation member,
   wherein, when viewed in a plan view, the adhesive member defines an internal region with the driving chip and a passage region connecting the internal region to an outer region of the adhesive member.

2. The display device of claim 1, wherein the lower member comprises at least one of a light-blocking member and an elastic member.

3. The display device of claim 1, wherein the first circuit board comprises:
   a first portion overlapped with the pad;
   a second portion, which is extended from the first portion and has a curvature; and a third portion, which is extended from the second portion and is overlapped with the lower member, and on which the driving chip is mounted.

4. The display device of claim 1, wherein the adhesive member comprises a plurality of stacked layers, and
a portion of at least one layer of the plurality of stacked layers corresponding to the passage region is absent.

5. The display device of claim 4, wherein the at least one layer is an adhesive layer.

6. The display device of claim 1, wherein the heat radiation member comprises a metal layer.

7. The display device of claim 6, further comprising a second circuit board including a first pad, which is electrically connected to the first circuit board, and a second pad, which is overlapped with the metal layer and is electrically connected to the metal layer.

8. The display device of claim 1, further comprising an input detection sensor between the window and the display panel and comprising a sensor electrode.

9. The display device of claim 8, wherein the display panel further comprises an encapsulation substrate coupled with the display substrate.

10. The display device of claim 9, wherein the sensor electrode is directly on the encapsulation substrate.

11. The display device of claim 1, further comprising an insulating layer under the heat radiation member and overlapped with the driving chip.

12. The display device of claim 1, wherein the display substrate comprises:
a first portion on which the pixels are located;
a second portion extended from the first portion and having a curvature; and
a third portion extended from the second portion and overlapped with the lower member.

13. A display device, comprising:
a window;
a display module under the window; and
a polarization film between the window and the display module,
wherein the display module comprises:
a display panel comprising a display substrate comprising a signal line and a pad connected to the signal line, and an encapsulation substrate facing the display substrate;
a sensor electrode directly on of the encapsulation substrate;
a lower member under the display panel;
a heat radiation member under the lower member;
a first circuit board overlapped with and electrically connected to the pad and overlapped with the heat radiation member;
a driving chip on the first circuit board and located between the first circuit board and the lower member; and
a first adhesive member coupling the first circuit board to the lower member,
wherein, when viewed in a plan view, the first adhesive member defines an internal region in which the driving chip is located and a passage region connecting the internal region to an outer region of the first adhesive member.

14. The display device of claim 13, wherein the first circuit board comprises:
a first portion overlapped with the pad;
a second portion extended from the first portion and having a curvature; and a third portion extended from the second portion and overlapped with the lower member, and on which the driving chip is mounted.

15. The display device of claim 13, further comprising:
a second circuit board electrically connected to the first circuit board and overlapped with the heat radiation member; and
a second adhesive member connecting the second circuit board to the lower member.

16. The display device of claim 15, wherein the first adhesive member is thicker than the second adhesive member.

17. The display device of claim 15, wherein the heat radiation member comprises a metal layer,
the second circuit board comprises a first pad electrically connected to the first circuit board, and a second pad overlapped with the metal layer and electrically connected to the metal layer, and
the second adhesive member comprises an anisotropic conductive film.

18. A display module, comprising:
a display substrate comprising a base layer, a light-emitting diode on the base layer, and a signal line on the base layer;
an encapsulation substrate facing the display substrate;
a sealing member coupling the display substrate to the encapsulation substrate;
a heat radiation member under the display substrate;
a first circuit board overlapped with and electrically connected to an end portion of the signal line and overlapped with the heat radiation member;
a driving chip mounted on the first circuit board and located between the first circuit board and the heat radiation member; and
an adhesive member coupling the first circuit board to the heat radiation member and enclosing the driving chip when viewed in a plan view,
wherein the adhesive member comprises:
a first portion having a first thickness; and
a second portion having a second thickness smaller than the first thickness,
wherein a length of the second portion is 5% to 20% of a length of the driving chip.

19. The display module of claim 18, wherein the adhesive member comprises:
a base film corresponding to the first portion and the second portion;
a first adhesive layer corresponding to the base film; and
a second adhesive layer, which is on the first portion and is not on the second portion.

20. A display device, comprising:
a window; and
a display module under the window,
wherein the display module comprises:
a display panel comprising a signal line and a pad connected to the signal line;
a lower member under the display panel;
a heat radiation member under the lower member;
a circuit board electrically connected to the pad, a portion of the circuit board being below the heat radiation member;
a driving chip on the circuit board and located between the circuit board and the heat radiation member;
an insulating layer under the heat radiation member and overlapped with the driving chip; and
a spacer between the circuit board and the heat radiation member, wherein the spacer comprises a first portion having a first thickness and a second portion having a second thickness smaller than the first thickness, the first portion and the second portion define a closed line when viewed in a plan view, and the driving chip is located within an internal region of the closed line when viewed in the plan view.

21. A display device, comprising:
a window; and
a display module under the window,
wherein the display module comprises:
- a display panel comprising a display substrate comprising a base layer, a pixel on the base layer, a signal line on the base layer, and a pad connected to the signal line;
- a lower member under the display panel;
- a heat radiation member under the lower member;
- a first circuit board overlapped with and electrically connected to the pad;
- a driving chip on the first circuit board and located between the first circuit board and the heat radiation member;
- an insulating member under the heat radiation member and overlapped with the driving chip; and
- an adhesive member coupling at least one of the insulating member and the heat radiation member to the first circuit board.

22. The display device of claim 21, wherein the lower member comprises at least one of a light-blocking member and an elastic member.

23. The display device of claim 21, wherein the first circuit board comprises:
- a first portion overlapped with the pad;
- a second portion, which is extended from the first portion and has a curvature; and
- a third portion, which is extended from the second portion and is overlapped with the lower member, and on which the driving chip is mounted.

24. The display device of claim 21, wherein the driving chip is disposed in an area defined by the adhesive member when viewed in a plan view, and the adhesive member is absent in the area,
the adhesive member comprises a plurality of stacked layers, and
a portion of at least one layer of the plurality of stacked layers corresponding to a predetermined region is absent.

25. The display device of claim 24, wherein the at least one layer is an adhesive layer.

26. The display device of claim 21, further comprising a second circuit board electrically connected to the first circuit board.

27. The display device of claim 26, wherein the heat radiation member comprises a metal layer.

28. The display device of claim 27, wherein the metal layer is electrically connected to the second circuit board.

29. The display device of claim 27, wherein the metal comprises at least one of copper, gold, silver and aluminum.

30. The display device of claim 26, further comprising an input detection sensor between the window and the display panel and comprising a sensor electrode; and
a third circuit board electrically connecting the input detection sensor to the second circuit board.

31. The display device of claim 21, wherein the insulating member overlaps a portion of the heat radiation member and exposes another portion of the heat radiation member when viewed in a plan view.

32. The display device of claim 21, wherein the insulating member comprises an electrical insulating tape.

33. The display device of claim 21, wherein the display substrate comprises:
- a first portion on which the pixel is located;
- a second portion extended from the first portion and having a curvature; and
- a third portion extended from the second portion and overlapped with the lower member.

* * * * *